(12) United States Patent
Kurashina et al.

(10) Patent No.: US 7,053,410 B2
(45) Date of Patent: May 30, 2006

(54) ELECTRO-OPTICAL DEVICE PROVIDING ENHANCED TFT LIFE

(75) Inventors: Hisaki Kurashina, Matsumoto (JP); Kenichi Takahara, Chino (JP); Hidenori Kawata, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/700,619

(22) Filed: Nov. 5, 2003

(65) Prior Publication Data

US 2004/0141223 A1 Jul. 22, 2004

(30) Foreign Application Priority Data

Nov. 26, 2002 (JP) .............................. 2002-342493
Sep. 12, 2003 (JP) .............................. 2003-321779

(51) Int. Cl.
H01L 29/04 (2006.01)
H01L 31/036 (2006.01)

(52) U.S. Cl. .............................. 257/72; 257/59; 349/39
(58) Field of Classification Search ................... 257/59, 257/72; 349/39
See application file for complete search history.

(56) References Cited

U.S. PATENT DOCUMENTS

| 6,016,174 | A | 1/2000 | Endo et al. | |
|---|---|---|---|---|
| 6,160,297 | A * | 12/2000 | Shimizu et al. | ............. 257/390 |
| 6,226,059 | B1 | 5/2001 | Yamamoto et al. | |
| 6,490,014 | B1 * | 12/2002 | Ohtani et al. | .................. 349/38 |
| 6,556,265 | B1 | 4/2003 | Murade | |
| 2002/0060756 | A1 | 5/2002 | Kurashina | |
| 2002/0153569 | A1 | 10/2002 | Katayama | |

FOREIGN PATENT DOCUMENTS

| JP | 05-175220 | 7/1993 | |
|---|---|---|---|
| JP | A-10-307305 | 11/1998 | |
| JP | PCT/JP99/06642 | * 6/2000 | .................. 257/59 |
| JP | A-2001-144301 | 5/2001 | |
| JP | 2001-265253 | 9/2001 | |
| JP | A-2001-265253 | 9/2001 | |
| JP | A-2001-356709 | 12/2001 | |
| JP | A-2002-244155 | 8/2002 | |
| JP | A-2002-131778 | 9/2002 | |
| WO | WO 99/47972 | 9/1999 | |
| WO | WO 01/82273 A1 | 11/2001 | |

* cited by examiner

Primary Examiner—Howard Weiss
(74) Attorney, Agent, or Firm—Oliff & Berridge, PLC

(57) ABSTRACT

An electro-optical device includes above a substrate: data lines extending in a first direction; scanning lines extending in a second direction in such a manner that the scanning lines and data lines cross each other; pixel electrodes and thin-film transistors each placed in corresponding regions corresponding to intersections of the scanning lines and data lines; storage capacitors disposed below the data lines and each electrically connected to the corresponding thin-film transistors and pixel electrodes; a capacitor line disposed above the data lines; first junction electrodes, formed using the same film used to form the data lines, each electrically connecting the corresponding pixel potential capacitor electrodes of the storage capacitors and pixel electrodes; and second junction electrodes, formed using the same film as that to form the data lines, each electrically connecting the corresponding constant potential capacitor electrodes of the storage capacitors and the capacitor line. The data lines, first junction electrodes, and second junction electrodes each including a nitride film.

15 Claims, 9 Drawing Sheets

F I G. 1
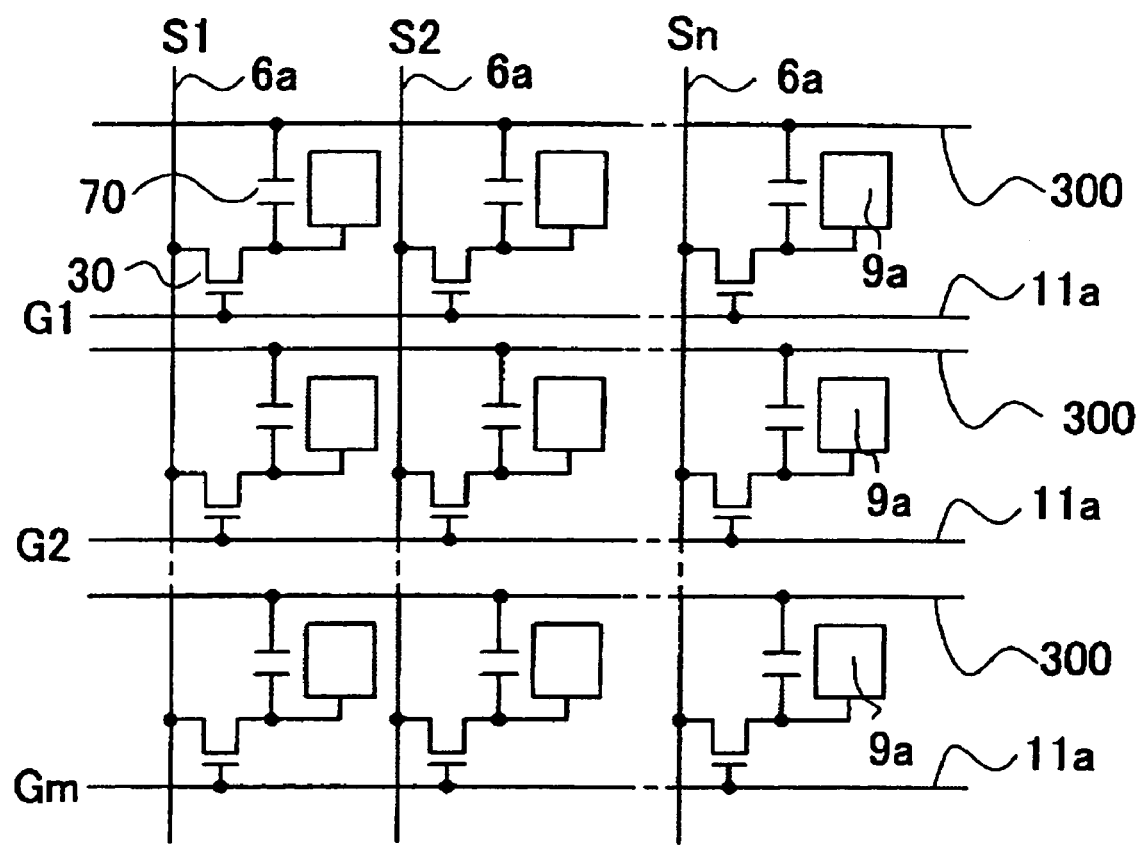

ELECTRO-OPTICAL DEVICE PROVIDING ENHANCED TFT LIFE

BACKGROUND OF THE INVENTION

1. Field of Invention

The present invention relates to an electro-optical device, such as a liquid crystal device and an electronic apparatus including such an electro-optical device. The present invention also relates to an electroluminescent (EL) device, a device including an electron-emitting element, and an electrophoretic device, such as an electronic paper sheet, wherein the electron-emitting element-including device includes field emission displays and surface-conduction electron-emitter displays.

2. Description of Related Art

Electro-optical devices, such as liquid crystal devices, each including the following components have been known: a pair of substrates and electro-optical materials, such as liquid crystals, placed therebetween. In such electro-optical devices, an image can be displayed by allowing light to pass through the substrates and electro-optical materials. The display of an image can be achieved as follows: the transmittance of light is varied for each pixel by changing the state of such electro-optical materials, thereby displaying different shades of gray for each pixel in a recognizable manner.

As such electro-optical devices, an active matrix addressing electro-optical device having on one of a pair of the substrates, pixel electrodes arranged in a matrix, scanning and data lines extending between the pixel electrodes, and thin-film transistors (TFTs) functioning as pixel-switching elements is known. In the active matrix addressing electro-optical device, each TFT is placed between each pixel electrode and data line for controlling the conduction therebetween. The TFTs are electrically connected to the corresponding scanning lines and data lines. Thereby, the TFTs can be turned on or off using the scanning lines and when the TFTs are turned on, image signals transmitted from the data lines can be applied to the pixel electrodes, that is, the light transmittance can be varied for each pixel.

In the electro-optical devices described above, the above components are arranged on one of the substrates. In order to arrange the components in a two-dimensional manner, a large area is necessary, and therefore there is a problem in that a pixel aperture ratio is lowered, wherein the pixel aperture ratio is defined as the ratio of the area of regions through which light passes to the entire surface area of the substrate. Thus, in related art manufacturing processes, the following configuration has been employed: the components are arranged in a three-dimensional manner, that is, the components are stacked by using interlayer insulating layers. In particular, the TFTs and the scanning lines functioning as gate electrodes of the TFTs are placed on one of the substrates, the data lines are placed thereabove, and the pixel electrodes and the like are placed thereabove. According to this configuration, the devices can be miniaturized and the pixel aperture ratio can be increased by arranging the components in an appropriate manner.

However, in the related art electro-optical devices, there is a problem that the life of the TFTs is relatively short. This is because when a semiconductor layer or gate insulating layer, which is a component of each TFT, absorbs moisture, water molecules diffuse into the interface between the semiconductor layer and gate insulating layer, whereby positive charges are generated and therefore the threshold voltage $V_{th}$ is increased in a relatively short period. This phenomenon is apt to occur in p-channel TFTs. The short life of the TFTs naturally affects the electro-optical devices as a whole so that the image quality is deteriorated from a relatively early period, and there is a fear that the devices do not operate.

SUMMARY OF THE INVENTION

The present invention has been made to address the above problem, provides an electro-optical device that includes long-life TFTs and can display a high-quality image. Furthermore, the present invention provides an electronic apparatus including such an electro-optical device.

In order to address the above problem, an electro-optical device of the present invention includes above a substrate: data lines extending in a first direction; scanning lines extending in a second direction in such a manner that the scanning lines and data lines cross each other; pixel electrodes and thin-film transistors each placed in the regions corresponding to the intersections of the scanning lines and data lines; storage capacitors disposed below the data lines and each electrically connected to the corresponding thin-film transistors and pixel electrodes; a capacitor line disposed above the data lines; first junction electrodes, formed using the same film as that to form the data lines, to each electrically connect the corresponding pixel potential capacitor electrodes and pixel electrodes; and second junction electrodes, formed using the same film as that to form the data lines, to each electrically connect the corresponding constant potential capacitor electrodes and the capacitor line. The data lines, first junction electrodes, and second junction electrodes each include a nitride film.

Since this electro-optical device includes the scanning lines, data lines, pixel electrodes, and thin-film transistors, active matrix addressing can be realized. Furthermore, since the above-mentioned components form part of a layered structure, the electro-optical device can be compact. Furthermore, the pixel aperture ratio can be enhanced by arranging the above components in an appropriate manner.

In particular, since the data lines, first junction electrodes, and second junction electrodes each include a nitride film, which can effectively reduce or prevent the penetration or diffusion of moisture, moisture can be reduced or prevented from entering the semiconductor layers of the thin-film transistors. Thereby, the problem that threshold voltage of the thin-film transistors is raised can be greatly reduced or prevented from occurring; hence, the life of the electro-optical device can be enhanced.

In an aspect of the electro-optical device of the present invention, the data lines, first junction electrodes, and second junction electrodes each preferably include a nitride film on a conductive layer disposed. In particular, the data lines, first junction electrodes, and second junction electrodes preferably have laminated layer structure including an aluminum film, titanium nitride film, and silicon nitride film.

According to this configuration, the data lines contain aluminum, which has relatively low resistance; hence, image signals can be continuously transmitted to the thin-film transistors and pixel electrodes. Furthermore, the data lines each include a silicon nitride film, which is relatively excellent in reducing or preventing moisture penetration; hence, the thin-film transistors are allowed to have an enhanced moisture resistance and therefore have a long life. The silicon nitride films may be formed by a plasma CVD process.

The titanium nitride films in the first and second junction electrodes function as barrier metal films to prevent the first and second junction electrodes from being penetrated when contact holes are formed in those electrodes by an etching process. Furthermore, the first and second junction electrodes, as well as the data lines, block moisture penetration; hence, the thin-film transistors are allowed to have an enhanced moisture resistance and therefore have a long life.

In an aspect of the electro-optical device of the invention, third junction electrodes are formed using the same film as that used to form the capacitor line, and the first junction electrodes are each electrically connected to the corresponding pixel electrodes with the corresponding third junction electrodes. The capacitor line and third junction electrodes each include a nitride film on a conductive film. Furthermore, the capacitor line and third junction electrodes preferably have laminated layer structure including an aluminum film, titanium nitride film, and silicon nitride film.

According to this configuration, the capacitor line located between the data lines and pixel electrodes can reduce or prevent capacitor coupling from occurring therebetween. That is, a possibility that voltage fluctuation occurs in the pixel electrodes upon conduction of the data lines can be reduced, thereby displaying a high-quality image.

In an aspect of the electro-optical device of the invention, fourth junction electrodes are formed on the same insulating layer having the fourth junction electrodes and thin-film transistors thereon, and the pixel potential capacitor electrodes are each electrically connected to the corresponding first junction electrodes with the corresponding fourth junction electrodes.

According to this configuration, the pixel potential capacitor electrodes are each electrically connected to the corresponding pixel electrodes with electrodes disposed below the pixel potential capacitor electrodes, and therefore penetration can be reduced or prevented from occurring when the storage capacitors are formed by an etching process.

In another aspect of the electro-optical device, the fourth junction electrodes are formed using the same film used to form gate electrodes of the thin-film transistors.

According to this configuration, the fourth junction electrodes can be obtained in a more simple way and at lower cost as compared with another configuration in which the fourth junction electrodes are formed in special steps. Furthermore, when the scanning lines include the gate electrodes, at least the gate electrodes of the scanning lines are preferably formed of a conductive polysilicon film so as to function effectively. In this case, the fourth junction electrodes also include the conductive polysilicon film and the like.

As is clear from this aspect of the present invention, the "fourth junction electrodes" of the invention need not be formed using the same film used to form the gate electrodes. In this case, the fourth junction electrodes and the gate electrodes are not made of the same material, and therefore a material used to form the fourth junction electrodes may be freely selected as long as the material is conductive.

In this configuration, the scanning lines and gate electrode are placed in different levels of the layered structure.

According to this configuration, the scanning lines may be placed on a lower level of the layered structure and the gate electrodes may be placed on an upper level thereof. The converse is also possible. As a result, in a level including the gate electrodes, in contrast to the case of forming the scanning lines, a striped pattern need not be formed. When the thin-film transistors are arranged in a matrix, a dotted pattern corresponding to such a matrix may be formed, thereby obtaining the gate electrodes. That is, the level including the gate electrodes can have a relatively large redundant area.

Thus, when the gate electrodes are formed using the same film used to form the fourth junction electrodes as described above, there is an advantage in that the fourth junction electrodes can be readily formed.

In this aspect, the scanning lines preferably have protrusions extending in parallel to the first direction.

According to this configuration, since the scanning lines are placed on a level different from a level than the gate electrodes or the thin-film transistor including the gate electrodes. The scanning lines have the protrusions extending in parallel to the first direction. The scanning lines can function as a lower light-shielding layer to shield the thin-film transistors against light. That is, light is reduced or prevented from entering semiconductor layers of the thin-film transistors, thereby reducing or preventing photo-leakage current from being generated. Thus, a high-quality image with no flicker can be displayed.

In this configuration, the scanning lines are preferably formed of conductive polysilicon or tungsten silicide (WSi), which has relatively satisfactory light-absorbing properties.

In another aspect of the electro-optical device of the present invention, the storage capacitors may each further include corresponding dielectric layers each disposed between the corresponding pixel potential capacitor electrodes and constant potential capacitor electrodes. The dielectric layers preferably include a plurality of sub-layers of different materials. One of the sub-layers preferably is formed of a material having a dielectric constant larger than those of other materials of other sub-layers. Furthermore, the dielectric layers each preferably include corresponding silicon dioxide sub-layers and silicon nitride sub-layers.

According to this configuration, the storage capacitors can have superior charge-storing properties, and therefore can further enhance potential-maintaining properties of the pixel electrodes; hence, a high-quality image can be displayed. The "high dielectric constant material" specified herein includes an insulating material containing at least one selected from the group including tantalum oxide (TaOx), barium strontium titanate (BST), lead zirconate titanate (PZT), titanium oxide ($TiO_2$), zirconium oxide ($ZrO_2$), hafnium oxide ($HfO_2$), silicon oxynitride (SiON), and silicon nitride (SiN). Especially when the high dielectric constant material, such as TaOx, BST, PZT, $TiO_2$, $ZiO_2$, or $HfO_2$ is used, capacitors having high capacitance can be formed in a limited area on the substrate. Alternatively, when the high dielectric constant material containing silicon, such as $SiO_2$, SiON, or SiN is used, stress to be generated in interlayer insulating layers or the like can be reduced.

Furthermore, according to an aspect of the invention, the pixel electrodes and the pixel potential capacitor electrodes included in the storage capacitors are electrically connected to each other in the layered structure with junction electrodes disposed below the respective electrodes. Namely, the pixel potential capacitor electrodes are located above the junction electrodes and the pixel electrodes are also located above the junction electrodes. That is, the junction electrodes are located at the lowest level among those of three electrodes. In this configuration, since the pixel electrodes and the pixel potential capacitor electrodes are electrically connected to each other with the junction electrodes, it becomes possible that electrical contacts are disposed below the pixel electrodes and the pixel potential capacitor electrodes, but are not disposed thereabove.

Here, that such electrical contacts are not located above the pixel potential capacitor electrodes means that the following arrangement is not necessary to electrically connect the pixel potential capacitor electrodes to the pixel electrodes in contrast to related art arrangements. The pixel potential capacitor electrodes are arranged such that the pixel potential capacitor electrodes can be seen when the layered structure is viewed from above. For example, when the pixel potential capacitor electrodes are located below the constant potential capacitor electrodes, and if the pixel potential capacitor electrodes must be formed by an etching process so as to be arranged in such a pattern that the pixel potential capacitor electrodes can be seen from above, the constant potential capacitor electrodes, located above the pixel potential capacitor electrodes, must be etched to have a predetermined pattern. That is, the constant potential capacitor electrodes must be formed by an etching process, such that the constant potential capacitor electrodes have an area smaller than that of the pixel potential capacitor electrodes, or such that the constant potential capacitor electrodes extend outside the pixel potential capacitor electrodes.

However, it is difficult to form such a pattern because the pixel potential capacitor electrodes are penetrated in many cases during etching. In general, conditions to form the constant potential capacitor electrodes by an etching process must be selected such that the etching rate of the dielectric layers is smaller than that of the constant potential capacitor electrodes. However, in general, the dielectric layers have a small thickness, and particularly in an aspect of the present invention, the dielectric layers contain the high dielectric constant material, such as SiN or TaOx in particular, perforations might not be prevented from extending through the dielectric layers. Furthermore, depending on a material contained in the dielectric layers, conditions cannot be selected such that the etching rate of the dielectric layers is smaller than that of the constant potential capacitor electrodes. Therefore, perforations extending through the pixel potential capacitor electrodes are caused in many cases. Such a phenomenon causes, in a bad case, a short circuit between a pair of electrodes included in each storage capacitor, and as a result, such storage capacitor cannot operate any more.

In contrast, in an aspect of the present invention, the electric contacts are located below the pixel potential capacitor electrodes. Therefore, it is not necessary to arrange the constant potential capacitor electrodes in such a difficult pattern.

As described above, according to an aspect of the present invention, the pixel potential capacitor electrodes can be securely electrically connected to the pixel electrodes. Furthermore, defects, such as the above-mentioned perforations caused in the pixel potential capacitor electrodes, the above short circuit, and the like can be reduced as well. Thus, the electro-optical device having high performance can be provided. Furthermore, since the electro-optical device including the junction electrodes and storage capacitors arranged as described above have optimum layered structure, the electro-optical device can be further miniaturized with ease and are allowed to have higher definition.

In the electro-optical device of an aspect of the present invention, the capacitor line is preferably formed of a light shielding film and to extend along the corresponding data lines and have a width larger than that of the data lines.

The electro-optical device preferably further includes a first insulating layer disposed as a base of the pixel electrodes and a second insulating layer disposed as a base of the capacitor line, wherein at least the first insulating layer is preferably planarized.

According to this configuration, the interlayer insulating layer is disposed under the pixel electrodes and the surface thereof is planarized by, for example, a chemical mechanical polishing (CMP) process. Therefore, the possibility that the orientation of electro-optical materials, such as liquid crystals is disturbed can be reduced, and thereby displaying a high-quality image becomes possible. The interlayer insulating layer disposed under the pixel electrodes has serious irregularities, thereon, due to the junction electrodes in some cases. Therefore, the planarization of the interlayer insulating layer is advantageous to provide an electro-optical device that operates more correctly.

In the aspect of the electro-optical device including the capacitor line as described above, another interlayer insulating layer is further provided as the base of the capacitor line and the surface thereof is preferably planarized.

According to this configuration, since the additional interlayer insulating layer is disposed as the base of the capacitor line and the surface thereof is planarized by, for example, a CMP process, the possibility that the orientation of electro-optical materials, such as liquid crystals, is disturbed can be reduced, and thereby displaying a high-quality image becomes possible.

Furthermore, in this configuration, when the interlayer insulating layer disposed under the pixel electrodes is also planarized, the above advantage can be enhanced.

Alternatively, the electro-optical device including the capacitor line may have the following configuration: on the substrate, the scanning lines including the gate electrodes for the thin-film transistors are placed, the storage capacitors are placed above the scanning lines, the data lines are placed above the storage capacitors, the capacitor lines are placed above the data lines, and the pixel electrodes are placed above the capacitor lines, wherein the storage capacitors each include the corresponding pixel potential capacitor electrodes, dielectric layers, and constant potential capacitor electrodes each disposed in this order from the lower layer side, and the junction electrodes are formed using the same film used to form the gate electrodes.

According to this configuration, the above layered structure disposed on the substrate has an optimum arrangement, or layout.

In order to further address the above problem, a process to manufacture an electro-optical device according to an aspect of the present invention includes the steps of forming, above a substrate: thin-film transistors; a first interlayer insulating layer on gate electrodes of the thin-film transistors; storage capacitors on the first interlayer insulating layer, the storage capacitors being each equipped with a pixel potential capacitor electrode, dielectric layer, and constant potential capacitor electrode disposed in this order from the bottom; a second interlayer insulating layer on the storage capacitors; data lines, first junction electrodes, and second junction electrodes on the second interlayer insulating layer using a conductive material containing a nitride film, the data lines being each electrically connected to the corresponding semiconductor layers, the first junction electrodes being each electrically connected to the corresponding pixel potential capacitor electrodes, and the second junction electrodes being each electrically connected to the corresponding constant potential capacitor electrodes; a third interlayer insulating layer on the data lines, first junction electrodes, and second junction electrodes; third junction electrodes and a capacitor line on the third interlayer insulating layer, the third junction electrodes being each electrically connected to the corresponding first junction electrodes, and the capacitor line being electrically connected to the corresponding second junction electrodes; a fourth interlayer insulating layer on the third junction electrodes and capacitor line; and pixel electrodes, each electrically connected to the corresponding third junction electrodes, on the fourth interlayer insulating layer.

According to this process, the electro-optical device can be relatively easily manufactured.

In an aspect of the manufacturing process of the invention, the step of forming the storage capacitor includes a sub-step of forming a first precursor film to form the pixel potential capacitor electrodes; a sub-step of forming a second precursor film to form the dielectric layers on the first precursor film; a sub-step of forming a third precursor film to form the constant potential capacitor electrodes on the second precursor film; and a sub-step of etching the first, second, and third precursor films in one step to form the pixel potential capacitor electrodes, dielectric layers, and constant potential capacitor electrodes.

According to the above aspect of the manufacturing process, in the step of forming the storage capacitors, the first, second, and third precursor films to form the pixel potential capacitor electrodes, dielectric layers, and constant potential capacitor electrodes, respectively, are once formed and these precursor films are then etched in one step. Therefore, the three components of the storage capacitors generally have the same shape when viewed from above. This makes it possible to form the storage capacitors having a relatively large capacitance without unnecessarily increasing the two-dimensional space for the components, that is, without lowering the pixel aperture ratio. Furthermore, in the above aspect, unlike in the related art, the following difficult procedure is not necessary: only the constant potential capacitor electrodes are etched but the dielectric layers and pixel potential capacitor electrodes are not etched and are allowed to remain as they are. Thus, according to an aspect of the present invention, the storage capacitors can be formed easily and reliably.

In another aspect of the manufacturing process of the invention, the step of forming the storage capacitors includes a sub-step of forming a first precursor film to form the pixel potential capacitor electrodes; a sub-step of etching the first precursor film to form the pixel potential capacitor electrodes; a sub-step of forming a second precursor film to form the dielectric layers on the first precursor film; a sub-step of forming a third precursor film to form the constant potential capacitor electrodes on the second precursor film; and a sub-step of etching the third precursor film to form the dielectric layers and constant potential capacitor electrodes, wherein the constant potential capacitor electrodes and dielectric layers have an area larger than that of the dielectric layers and pixel potential capacitor electrodes.

In this aspect, unlike the former description, the first precursor film is etched once, whereby the pixel potential capacitor electrodes are formed, and the dielectric layers and constant potential capacitor electrodes are then formed. Furthermore, in this aspect, the constant potential capacitor electrodes have an area larger than that of the dielectric layers and pixel potential capacitor electrodes. Therefore, the storage capacitors having the following configuration can be formed: a configuration in which the dielectric layers and constant potential capacitor electrodes each cover the corresponding pixel potential capacitor electrodes. Thus, each dielectric layer is in contact with each pixel potential capacitor electrode and constant potential capacitor electrode with a larger area, and therefore the storage capacitors having a larger capacitance are achieved. More specifically, for example, sides of these three components of the storage capacitors can be used as capacitor portions, and as a result, increase in capacitance can be expected. Thus, when the pixel potential capacitor electrodes are formed to have a large thickness or the like, sides of the pixel potential capacitor electrodes have a larger area, thereby effectively obtaining an increased capacitance. In addition, according to this configuration, each pixel potential capacitor electrode and constant potential capacitor electrode are hardly short-circuited.

Incidentally, in this aspect, when the third precursor film is etched, the second precursor film may be also etched.

An electronic apparatus of an aspect of the present invention includes the above-mentioned electro-optical device. The electronic apparatus may include a modified electro-optical device.

Since the electronic apparatus of an aspect of the invention includes the above-mentioned electro-optical device, the pixel electrodes can be securely electrically connected to the storage capacitors, which operate correctly. Thereby, a high-quality image can be displayed. Furthermore, the following various electronic apparatuses including the electro-optical device, such as a liquid crystal device, having high reliability can be achieved: projective display units, liquid crystal TVs, mobile phones, electronic notebooks, word processors, view finder-type or direct monitoring type video tape recorders, work stations, TV phones, POS terminals, and touch panels.

The above advantages and gains of the present invention will become apparent from the following description of preferred exemplary embodiments.

BRIEF DESCRIPTION OF THE DRAWINGS

FIG. 1 is a schematic showing an equivalent circuit including various elements, wiring lines, and the like for pixels arranged, in a matrix, in an image display region of an electro-optical device according to an exemplary embodiment of the present invention;

DETAILED DESCRIPTION OF PREFERRED EMBODIMENTS

Embodiments of the present invention will now be described with reference to the accompanying figures. In the exemplary embodiments described below, an electro-optical device of an aspect of the present invention functions as a liquid crystal device.

Configuration of Pixel Portion

Figure 2:
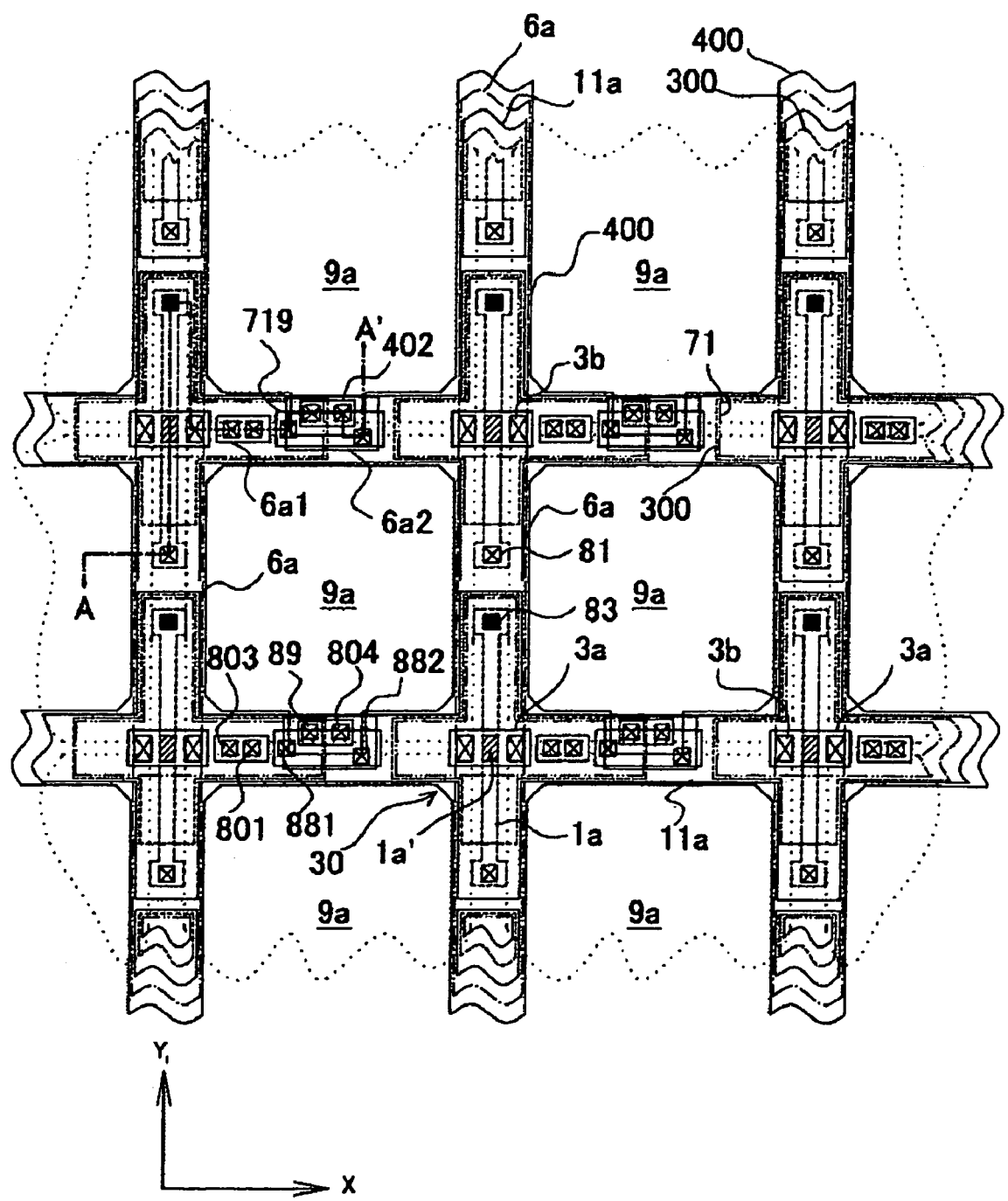
FIG. 2 is a plan view showing a plurality of the pixels, adjacent to each other, placed on a TFT array substrate, included in the electro-optical device according to an exemplary embodiment of the present invention, having data lines, scanning lines, and pixel electrodes thereon.
Figure 3:
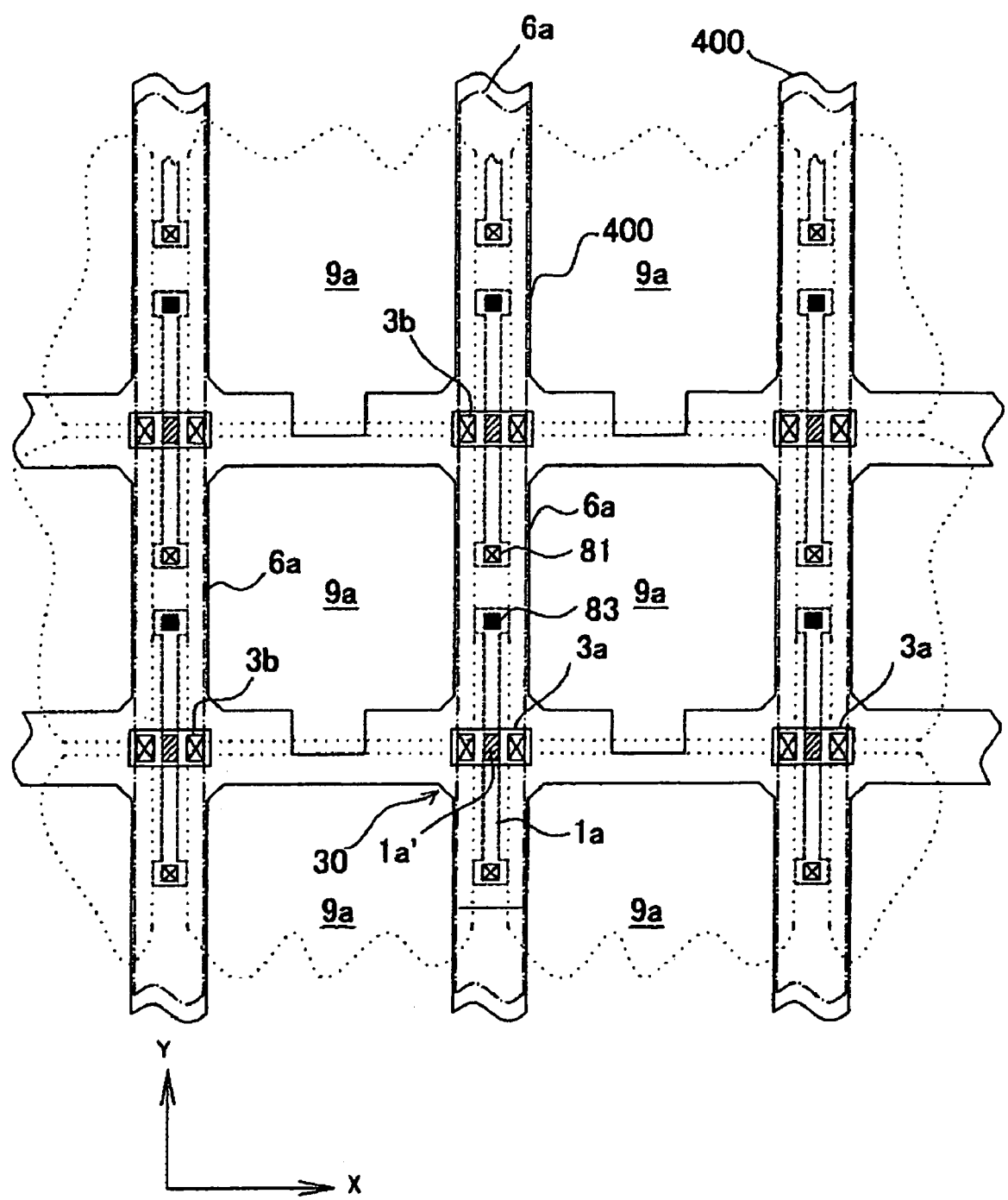
FIG. 3 is a plan view showing a principal portion of FIG. 2.
Figure 4:
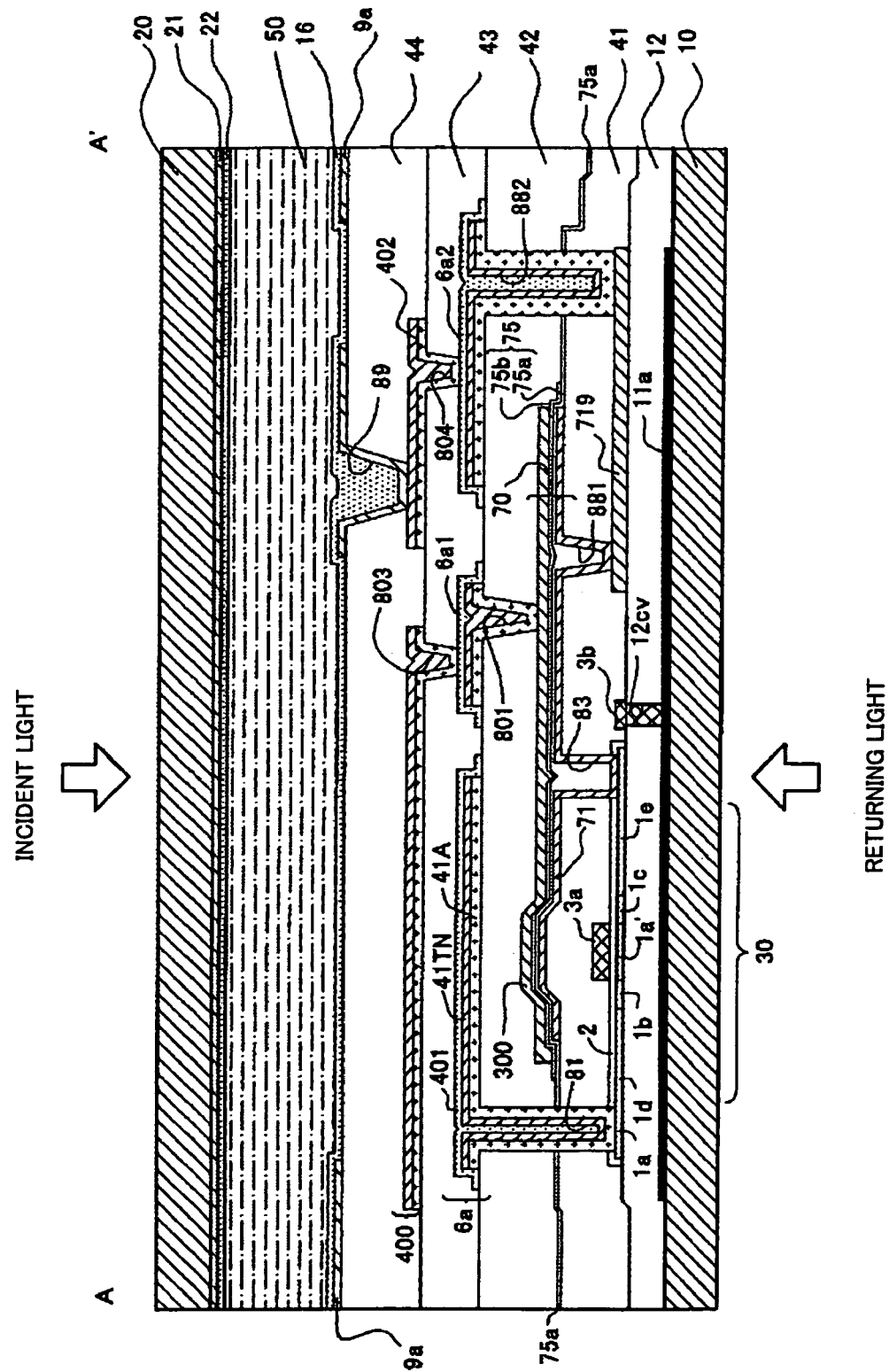
FIG. 4 is a sectional view taken along the plane A–A' of FIG. 2.

A configuration of each pixel portion of an electro-optical device according to an exemplary embodiment of the present invention is described with reference to FIGS. 1 to 4. FIG. 1 is a schematic showing an equivalent circuit including various elements and wiring lines for pixels arranged in a matrix, which constitute an image display region of the electro-optical device. FIG. 2 is a plan view showing a plurality of the pixels, adjacent to each other, placed on a TFT array substrate having data lines, scanning lines, and pixel electrodes thereon. FIG. 3 is a plan view showing only a principal portion of FIG. 2. In particular, FIG. 3 is a plan view showing the arrangement of the data lines, shielding layers, and pixel electrodes. FIG. 4 is a sectional view taken along the plane A–A' of FIG. 2. In FIG. 4, in order to show layers and members on a recognizable scale, different scales are used depending on the size of the layers and members.

With reference to FIG. 1, a plurality of the pixels are arranged in a matrix, in which constitute the image display region of the electro-optical device of this exemplary embodiment, and each include corresponding pixel electrodes 9a and TFTs 30 for controlling the switching of the pixel electrodes. Data lines 6a to which image signals S1, S2, . . . , and Sn are transmitted are each electrically connected to corresponding sources of the TFTs 30. The image signals S1, S2, . . . , and Sn written in the data lines 6a may be line-sequentially transmitted to the data lines 6a in this order or may be transmitted to each group of the data lines 6a adjacent to each other.

Gate electrodes are each electrically connected to corresponding gates of the TFTs 30, and scanning signals G1, G2, . . . , and Gm are line-sequentially applied to scanning lines 11a and the gate electrodes in this order at a predetermined timing in an intermittent mode. The pixel electrodes 9a are electrically connected to drains of the TFTs 30, and the image signals S1, S2, . . . , and Sn transmitted from the data lines 6a are written into with the pixel electrodes 9a at a predetermined timing by turning on the TFTs 30 functioning as switching elements for a predetermined period.

The image signals S1, S2, . . . , and Sn recorded in the liquid crystals, which are an example of an electro-optical material, through the pixel electrodes 9a have a predetermined level and are retained between the pixel electrodes 9a and a counter electrode disposed on a counter substrate for a predetermined period. When the alignment and order of liquid crystal molecules are changed depending on the level of applied voltages, the liquid crystals modulate light, thereby displaying shades of gray. In a normally white mode, the transmittance of incident light is decreased in reverse proportion to the voltage applied each pixel. In a normally black mode, the transmittance of incident light is increased in proportion to the voltage applied each pixel. Thereby, as a whole, light having contrast depending on the image signals S1, S2, . . . , and Sn is emitted from the electro-optical device.

In order to reduce or prevent the retained image signals S1, S2, . . . , and Sn from leaking, storage capacitors 70 are each placed in parallel to corresponding liquid crystal capacitors disposed between the pixel electrodes 9a and the counter electrode. The storage capacitors 70 are each placed adjacent to the corresponding scanning lines 11a and each include constant potential capacitor electrodes and capacitor electrodes 300 that are connected to a constant voltage power supply.

An actual configuration of the electro-optical device is described below with reference to FIGS. 2 to 4. In the electro-optical device, the circuit operation described above can be achieved using the data lines 6a, scanning lines 11a, gate electrodes, and TFTs 30.

With reference to FIG. 2, a plurality of the pixel electrodes 9a (the outline is indicated by a dotted line) are arranged on a TFT array substrate 10 in a matrix. The data lines 6a and scanning lines 11a extend along the vertical and horizontal boundaries between the pixel electrodes 9a, respectively. The data lines 6a have a layered structure including an aluminum film and the like, as described below. The scanning lines 11a include, for example, a conductive polysilicon film or the like. The scanning lines 11a are each electrically connected to corresponding gate electrodes 3a facing channel regions 1a' of corresponding semiconductor layers 1a, the channel regions 1a' being indicated by the right-upward diagonal lines in the figure. The gate electrodes 3a are each included in the corresponding scanning lines 11a. The TFTs 30 to switch the pixels are each placed at the corresponding intersections of the gate electrodes 3a and data lines 6a and each include the corresponding gate electrodes 3a which are included in the scanning lines 11a that face the channel regions 1a'. That is, the TFTs 30 (except for the gate electrodes 3a) are each placed between the corresponding gate electrodes 3a and scanning lines 11a.

Next, with respect to FIG. 4, which is a sectional view taken along the plane A–A' of FIG. 2, the electro-optical device includes the TFT array substrate 10 made of, for example, quartz, glass, or silicon and a counter substrate 20 that faces the TFT array substrate 10 and is made of, for example, glass or silicon.

As shown in FIG. 4, the pixel electrodes 9a are disposed on the TFT array substrate 10, and a first alignment layer 16 treated by a predetermined process, such as a rubbing process, is placed on the pixel electrodes 9a. The pixel electrodes 9a include, for example, a transparent conductive film, such as an ITO film. On the other hand, a counter electrode 21 is placed over the entire surface of the counter substrate 20, and a second alignment layer 22 treated by a predetermined process, such as a rubbing process, is placed under the counter electrode 21. The counter electrode 21, similarly to the pixel electrodes 9a, include, for example, a transparent conductive film, such as an ITO film. The first and second alignment layers 16 and 22 contain, for example, a transparent organic material, such as polyimide.

In a space between the TFT array substrate 10, and the counter substrate 20 facing the TFT array substrate 10, surrounded by a sealing member 52 (see FIGS. 8 and 9) described below, electro-optical substances, such as liquid crystals, is enclosed to form a liquid crystal layer 50. The liquid crystal layer 50 takes a predetermined alignment state due to the first and second alignment layers 16 and 22 when no electric field is applied to the liquid crystal layer 50 from the pixel electrodes 9a. The liquid crystal layer 50 contains electro-optical substances containing, for example, one or more species of nematic liquid crystals. The sealing member 52 is used to join the TFT array substrate 10 to counter substrate 20 and is placed at the periphery thereof. The sealing member 52 contains an adhesive, such as a photo-curable resin, or a thermosetting resin and spacers, such as glass fibers or glass beads, to provide a predetermined distance between the substrates.

Various components may be disposed on the TFT array substrate 10 in a stacked manner in addition to the pixel electrodes 9 and first alignment layer 16, thereby forming a layered structure. With reference to FIG. 4, the layered structure has a first level including the scanning lines 11a, a second level including the TFTs 30 including the gate electrodes 3a and the like, a third level including the storage capacitors 70, a fourth level including the data lines 6a and the like, a fifth level including a shielding layer 400 and the like, a sixth (uppermost) level including the pixel electrodes 9a, the first alignment layer 16 and the like, disposed in that order from the bottom. Furthermore, a base insulating layer 12 is placed between the first and second levels, a first interlayer insulating layer 41 is placed between the second and third levels, a second interlayer insulating layer 42 is placed between the third and fourth levels, a third interlayer insulating layer 43 is placed between the fourth and fifth levels, and a fourth interlayer insulating layer 44 is placed between the fifth and sixth levels, respectively, in order to reduce or prevent the above-mentioned components from being short-circuited. These insulating layers 12, 41, 42, and 43 also have contact holes to electrically connect, for example, the data lines 6a to heavily doped source regions 1d disposed in the semiconductor layers 1a of the TFTs 30. These stacked components are described below in order from the bottom.

Firstly, the first level includes the scanning lines 11a including a single metal substance, alloy, metal silicide or polysilicide including at lease one of high-melting-point metals selected from the group including titanium (Ti), chromium (Cr), tungsten (W), tantalum (Ta), and molybdenum (Mo); stacked layer thereof; conductive polysilicon, or the like. The scanning lines 11a are arranged in parallel to the x-axis of FIG. 2 in a striped pattern when viewed from above. In particular, each scanning line 11a has a main portion extending in parallel to the x-axis and protrusive portions extending in parallel to the y-axis which is parallel to the data lines 6a and the shielding layer 400, as shown in FIG. 2. The protrusive portions projecting from the scanning lines 11a adjacent to each other are not connected to each other; hence, the scanning lines 1a are isolated from each other.

Thus, each scanning line 11a has a function of simultaneously turning on or off the TFTs 30 placed in the same row. Furthermore, since the scanning lines 11a extend so as to fill regions in which no pixel electrodes 9a are placed, the scanning lines 11a have a function of blocking light incident from the lower surfaces of the TFTs 30. Thereby, photo-leakage currents are reduced or prevented from being generated in the semiconductor layers 1a of the TFTs 30; hence, a high-quality image with no flicker can be displayed. When the scanning lines 11a include conductive polysilicon, the scanning lines 11a have a function of absorbing light.

Next, the second level includes the TFTs 30 including the gate electrodes 3a. With reference to FIG. 4, the TFTs 30 have a lightly doped drain (LDD) structure and each include the corresponding gate electrodes 3a, the corresponding semiconductor layers 1a, corresponding insulating layers 2 to insulate the gate electrodes 3a from the semiconductor layers 1a. The semiconductor layers 1a each include the corresponding channel regions 1a' made of a polysilicon film, for example, lightly doped source regions 1b, lightly doped drain regions 1c, heavily doped source regions 1d, and heavily doped drain regions 1e. In the channel regions 1a', channels are formed when electric fields are applied from the gate electrodes 3a.

In particular, in this exemplary embodiment, the second level further includes lower junction electrodes 719 formed using the same film as that for forming the gate electrodes 3a. With reference to FIG. 2, the lower junction electrodes 719 are each placed at substantially the corresponding center of one side of the pixel electrodes 9a so as to have a dotted pattern. Since the lower junction electrodes 719 are formed using the same film as that used to form the gate electrodes 3a, the lower junction electrodes 719 contain conductive polysilicon or the like when the gate electrodes 3a contain conductive polysilicon or the like.

The TFTs 30 preferably have the LDD structure as shown in FIG. 4. However, the TFTs 30 may have an off-set structure without implanting impurities into the lightly doped source regions 1b and lightly doped drain regions 1c or may have a self-aligned structure having heavily doped source regions and heavily doped drain regions formed in a self-aligned manner by implanting impurities into regions of the semiconductor layers 1a at a high dose using the gate electrodes 3a as masks. Furthermore, in this exemplary embodiment, the TFTs 30 have a single gate structure in which only one gate electrode 3a is placed between each heavily doped source region 1d and heavily doped drain region 1e. However, the TFTs 30 may have a double or more gate structure having two or more of the gate electrodes 3a placed between these regions. When the TFTs 30 have the above-mentioned double gate structure or triple or more gate structure, currents can be reduced or prevented from leaking at junctions of channels and source or drain regions, whereby the current consumed during the turning-off period can be reduced.

Furthermore, the semiconductor layers 1a included in the TFTs 30 may be single-crystal or non-single-crystal layers. A known process, such as a cladding process, can be used to form such single crystal layers. When the semiconductor layers 1a are the single crystal layers, the performance of peripheral circuits can be enhanced.

The base insulating layer 12 containing, for example, silicon oxide or the like is disposed between the scanning lines 11a and the TFTs 30 disposed thereabove. The base insulating layer 12 insulates the TFTs 30 from the scanning lines 11a. Furthermore, the base insulating layer 12 reduces or prevents properties of the TFTs 30 for switching the pixels from being deteriorated due to the surface roughness of the TFT array substrate 10 caused by the surface polishing and contaminants remaining after cleaning, because the base insulating layer 12 lies over the TFT array substrate 10.

The base insulating layer 12 has slots 12cv, disposed at both sides of each semiconductor layer 1a when viewed from above, functioning as contact holes. The slots 12cv have the same length and width as those of channels of the semiconductor layers 1a or a length larger than that of the channels, wherein the semiconductor layers 1a extend along the data lines 6a as described below. The gate electrodes 3a placed above the slots 12cv have recessed portions disposed at lower side thereof corresponding to the slots 12cv. The gate electrodes 3a have side walls 3b extending therefrom because the side walls 3b are formed monolithically with the gate electrodes 3a in such a manner that the slots 12cv are filled with the same material as that used to form the gate electrodes 3a. Thus, as shown in FIG. 2, sides of each semiconductor layer 1a of the TFTs 30 are each covered with the corresponding side walls 3b, and therefore light is reduced or prevented from entering at least from these portions.

The side walls 3b fill the corresponding slots 12cv and the lower ends of the side walls 3b contact with the scanning lines 11a. Since the external electrodes 11 are arranged in a striped pattern as described above, the gate electrodes 3a and scanning lines 11a placed in the same row always have the same potential.

In an aspect of the present invention, additional scanning lines including the gate electrodes 3a may be arranged in parallel to the scanning lines 11a. In this configuration, the scanning lines 11a, and additional scanning lines, form a redundant wiring structure.

Thus, even if some of the scanning lines 11a have defects and therefore normal conductance is not available, the TFTs 30 can be normally controlled through the additional scanning lines placed in the same row as that of the scanning lines 11a as long as the additional scanning lines have no defects.

The third level includes the storage capacitors 70. The storage capacitors 70 each include corresponding lower electrodes 71 functioning as the pixel potential capacitor electrodes, the corresponding capacitor electrodes 300 functioning as the constant potential capacitor electrodes, and corresponding dielectric layers 75 each disposed between the corresponding lower electrodes 71 and capacitor electrodes 300. The lower electrodes 71 each face the corresponding capacitor electrodes 300 and are each connected to the corresponding heavily doped drain regions 1e and pixel electrodes 9a of the TFTs 30. According to the storage capacitors 70, potential-retaining properties of the pixel electrodes 9a can be greatly enhanced. With reference to FIG. 2, the storage capacitors 70 of this exemplary embodiment do not extend to light-transmitting regions which substantially correspond to light-transmitting regions, that is, the storage capacitors 70 are placed within light-shielding regions so that this electro-optical device can have a relatively large aperture ratio as a whole, and thus can display brighter images.

In particular, the lower electrodes 71 include a conductive polysilicon film and function as the pixel potential capacitor electrodes. However, the lower electrodes 71 may include a single layer film or a multi-layer film containing a metal or alloy. The lower electrodes 71 not only function as the pixel potential capacitor electrodes but also each electrically connect the corresponding pixel electrodes 9a to the corresponding heavily doped drain regions 1e of the TFTs 30. This exemplary embodiment is characterized in that the above electrical connection is established via the lower junction electrodes 719. This feature is described below.

The capacitor electrodes 300 function as the constant potential capacitor electrodes of the storage capacitors 70. In this exemplary embodiment, in order to allow the capacitor electrodes 300 to have a constant potential, the capacitor electrodes 300 are electrically connected to the shielding layer 400 having a constant potential.

Particularly in this exemplary embodiment, the capacitor electrodes 300 are arranged on the TFT array substrate 10 in a dotted pattern such that the capacitor electrodes 300 correspond to the pixels. The lower electrodes 71 have substantially the same shape as that of the capacitor electrodes 300.

Thus, the storage capacitors 70 of this exemplary embodiment do not occupy unnecessarily large space, that is, do not lower the pixel aperture ratio while the storage capacitors 70 have an optimum capacitance under the above circumstances. That is, the storage capacitors 70 of this exemplary embodiment occupy a smaller space but a larger capacitance.

In particular, as shown in FIG. 4, the capacitor electrodes 300 have an area slightly larger than that of the lower electrodes 71, that is, the capacitor electrodes 71 each cover the corresponding lower electrodes 71. According to this configuration, as is clear from the figure, sides of the capacitor electrodes 300 and lower electrodes 71 can be used as capacitors (see a left region of each storage capacitor 70 shown in FIG. 4), thereby enhancing the capacitance. A short circuit between them hardly occurs. From this viewpoint, in order to increase the area of the sides, it is also effective that, for example, the lower electrodes 71 have a relatively large thickness.

With reference to FIG. 4, the dielectric layers 75 are made of a relatively thin silicon nitride or silicon dioxide film, such as a high temperature oxide (HTO) or low temperature oxide (LTO) film, having a thickness of 5 to 20 nm, for example. In order to increase the capacitance of the storage capacitors 70, it is preferable to reduce the thickness of the dielectric layers 75 as long as the reliability of the dielectric layers 75 is obtained. As shown in FIG. 4, particularly in this exemplary embodiment, the dielectric layers 75 have a double layer structure including a silicon dioxide sub-layer 75a as a lower layer and a silicon nitride sub-layer 75b as an upper layer. The silicon nitride sub-layers 75b, which are upper sub-layers, have a size slightly larger than that of the lower electrodes 71 functioning as the pixel potential capacitor electrodes and are each placed within the light-shielding regions (non-aperture regions). According to such a configuration, the storage capacitors 70 can have a large capacitance because of the presence of the silicon nitride sub-layers 75b having a relatively large dielectric constant, and yet the dielectric strength of the storage capacitors 70 is not lowered because of the presence of the silicon dioxide sub-layer 75a. Since the dielectric layers 75 have such double layer structure, the above two conflicting advantages can be achieved. The silicon nitride sub-layers 75b, which are apt to be colored, have a size slightly larger than that of the lower electrodes 71 and not placed in the light-transmitting regions. That is, the silicon nitride sub-layers 75b are placed within the light-shielding regions, thereby reducing or preventing the transmittance from being lowered. Furthermore, the silicon nitride sub-layers 75b reduces or prevents water from entering the TFTs 30. Thereby, in this exemplary embodiment, the threshold voltage of the TFTs 30 is reduced or prevented from being increased and therefore the electro-optical device can be operated for a long period. In this exemplary embodiment, the dielectric layers 75 have the double layer structure. However, the dielectric layers 75 may have a triple or more layer structure including, for example, silicon dioxide sub-layers and a silicon nitride sub-layer disposed therebetween if appropriate.

The first interlayer insulating layer 41 is placed on the TFTs 30 or the gate electrodes 3a and the lower junction electrodes 719, and under the storage capacitors 70. The first interlayer insulating layer 41 includes silicate glass, such as nondoped silicate glass (NSG), phosphorus silicate glass (PSG), boron silicate glass (BSG), or boron phosphorus silicate glass (BPSG); silicon nitride; or silicon dioxide. The first interlayer insulating layer 41 used herein preferably contains NSG The first interlayer insulating layer 41 has first contact holes 81, extending therethrough, to each electrically connect the corresponding heavily doped source regions 1d of the TFTs 30 to the corresponding data lines 6a described below, wherein the first contact holes 81 further extend through the second interlayer insulating layer 42. The first interlayer insulating layer 41 also has second contact holes 83 to each electrically connect the corresponding heavily doped drain regions 1e of the TFTs 30 to the corresponding lower electrodes 71 of the storage capacitors 70.

The first interlayer insulating layer 41 further has third contact holes 881, extending therethrough, to each electrically connect the corresponding lower electrodes 71 which are the pixel potential electrodes of the storage capacitors 70 to the corresponding lower junction electrodes 719. The first interlayer insulating layer 41 further has fourth contact holes 882, extending through the second interlayer insulating layer described below, to each electrically connect the corresponding lower junction electrodes 719 to second junction electrodes 6a2 described below.

The dielectric layers 75 are not placed in regions in which the first contact holes 81 and fourth contact holes 882 among the above four kinds of contact holes are placed, that is, aperture regions are each placed on the corresponding dielectric layers 75. This is because the first contact holes 81 must be each used to electrically connect the corresponding heavily doped source regions 1d to the corresponding data lines 6a and the fourth contact holes 882 must extend through the first and second interlayer insulating layers 41 and 42. If such apertures are provided in the dielectric layers 75, when hydrotreatment is carried out on the semiconductor layers 1a of the TFTs 30, hydrogen can be readily delivered to the semiconductor layers 1a through the apertures.

In this exemplary embodiment, the first interlayer insulating layer 41 may be fired at about 1,000° C., thereby activating ions implanted into polysilicon films included in the semiconductor layers 1a or gate electrodes 3a.

The fourth level disposed on the third level includes the data lines 6a. The data lines 6a are arranged in a striped pattern such that they extend in the same direction as the semiconductor layers 1a extend, that is, in parallel to the y-axis in FIG. 2. With reference to FIG. 4, each data line 6a has a triple layer structure including an aluminum film (see 41A in FIG. 4), a titanium nitride film (see 41TN in FIG. 4), and a silicon nitride film (see 401 in FIG. 4) disposed in this order from the lower side. The silicon nitride film 401 has a size slightly larger than that of the titanium nitride film 41TN and aluminum film 41A so as to cover the titanium nitride film 41TN and aluminum film 41A. Since the data lines 6a contain aluminum having a relatively small resistance, image signals can be smoothly transmitted to the TFTs 30 and the pixel electrodes 9a. Furthermore, since the date lines 6a include the silicon nitride films 401 having a relatively excellent function of blocking water penetration, the TFTs 30 can be enhanced in moisture resistance properties, thereby extending the life of the TFTs 30. The silicon nitride films 401 are preferably formed by a plasma CVD process.

The fourth level further includes first junction electrodes 6a1 and second junction electrodes 6a2, the first and second junction electrodes 6a1 and 6a2 being formed using the same film as that used to form the data lines 6a. With reference to FIG. 2, the first and second junction electrodes 6a1 and 6a2 are not continuously formed with the corresponding data lines 6a when viewed from above, that is, these components are arranged in independent patterns. In a left area of FIG. 2, each data line 6a, first junction electrode 6a1, and second junction electrode 6a2 are arranged in this order from the left, wherein the first junction electrode 6a1 has a substantially rectangular shape and the second junction electrode 6a2 has a substantially rectangular shape and an area slightly larger than that of the first junction electrode 6a1. The first and second junction electrodes 6a1 and 6a2 are formed in the same step as that for forming the data lines 6a, and therefore have the triple layer structure including each aluminum film 41A, titanium nitride film 41TN, and plasma silicon nitride film 401 disposed in this order from the lower layer.

The plasma silicon nitride films 401 have a size slightly larger than that of the titanium nitride films 41TN and aluminum films 41A so as to cover the corresponding titanium nitride films 41TN and aluminum films 41A. The plasma silicon nitride films 401 function as barrier metal films to prevent the first and second junction electrodes 6a1 and 6a2 from being penetrated when fifth and sixth contact holes 803 and 804 are formed in the third interlayer insulating layer 43 by an etching process.

Furthermore, since the silicon nitride films 401 are each located at the top of the corresponding first junction electrodes 6a1 and second junction electrodes 6a2 and have a function of blocking water penetration, the TFTs 30 can be enhanced in the moisture resistance properties, thereby achieving long life of the TFTs 30. The silicon nitride films 401 are preferably formed by a plasma CVD process.

The second interlayer insulating layer 42 is placed on the storage capacitors 70 and is placed under the data lines 6a. The second interlayer insulating layer 42 contains silicate glass, such as NSG; PSG, BSG, or BPSG; silicon nitride; or silicon dioxide. The second interlayer insulating layer 42 used herein is preferably formed by a plasma CVD process using TEOS gas. The second interlayer insulating layer 42 has the first contact holes 81, extending therethrough, each electrically connecting the corresponding heavily doped source regions 1d of the TFTs 30 to the corresponding data lines 6a. The second interlayer insulating layer 42 further has seventh contact holes 801, extending therethrough, for each electrically connecting the corresponding first junction electrodes 6a1 to the corresponding capacitor electrodes 300 functioning as the upper electrodes of the storage capacitors 70. Furthermore, the second interlayer insulating layer 42 has the fourth contact holes 882, extending therethrough, for each electrically connecting the corresponding lower junction electrodes 719 to the corresponding second junction electrodes 6a2.

The fifth level disposed on the fourth level includes the shielding layer 400. With reference to FIGS. 2 and 3, the shielding layer 400 has a grid pattern and extends in parallel to the x and y-axes. The portions of the shielding layer 400 extending in parallel to the y-axis are particularly formed such that they have a width larger than that of the data lines 6a and cover the data lines 6a. The portions of the shielding layer 400 extending in parallel to the x axis each have corresponding notches, each disposed near the center of a side of each pixel electrode 9a, to secure regions to form third junction electrodes 402 described below.

Furthermore, substantially triangular sections are each disposed at corresponding corners of each intersection of the shielding layer portions extending in parallel to the x- and y-axes in FIGS. 2 and 3. Since the shielding layer 400 has the substantially triangular sections, light can be securely reduced or prevented from entering the semiconductor layers 1a of the TFTs 30. That is, light incident on the semiconductor layers 1a from a diagonal upward direction is reflected or absorbed by the triangular sections, thereby not reaching the semiconductor layers 1a. Thus, photo-leakage currents are reduced or prevented from being generated, whereby a high-quality image with no flicker can be displayed.

The shielding layer 400 extends from the image display region 10a having the pixel electrodes 9a therein to the peripheral areas. The shielding layer 400 is electrically connected to a constant potential power source to have a constant potential. The "constant potential power source" may be a positive or negative constant potential power source electrically connected to a data line-driving circuit 101, or another constant potential power source electrically connected to the counter electrode 21 on the counter substrate 20.

Since the shielding layer 400 is formed to entirely cover the data lines 6a as shown in FIG. 3 and has a constant potential in this way, an influence of capacitance coupling occurring between the data lines 6a and pixel electrodes 9a can be eliminated. That is, the potential of the pixel electrodes 9a can be reduced or prevented from fluctuating in accordance with current application to the data lines 6a. Therefore, uneven display can be reduced or prevented from being formed along the data lines 6a on a screen. Particularly in this exemplary embodiment, since the shielding layer 400 has a grid pattern, undesirable capacitance coupling can be reduced or prevented from occurring in regions in which the scanning lines 11a extend.

Furthermore, in the fourth level, third junction electrodes 402, an example of the junction electrodes specified herein, are formed using the same film used to form the shielding layer 400. The third junction electrodes 402 are each used to electrically connect the corresponding second junction electrodes 6a2 to the corresponding pixel electrodes 9a through eighth contact holes 89 described below. The shielding layer 400 is not continuously formed with the third junction electrodes 402 but is isolated from the third junction electrodes 402 when viewed from above.

On the other hand, the shielding layer 400 and third junction electrodes 402 each have a double layer structure including a lower aluminum film and an upper titanium nitride film disposed in this order. In the third junction electrodes 402, the lower aluminum films are each electrically connected to the corresponding second junction electrodes 6a2, while the upper titanium nitride films are each electrically connected to the corresponding pixel electrodes 9a containing ITO or the like. In this configuration, the titanium nitride films can be securely connected to the pixel electrodes 9a in particular. On the contrary, if each aluminum film is directly connected to each pixel electrode 9a containing ITO, galvanic corrosion occurs therebetween, and an electrical connection cannot be securely established therebetween due to breaking of the aluminum film or insulation caused by the formation of alumina. In this exemplary embodiment, since the third junction electrodes 402 can be securely connected to the pixel electrodes 9a as described above, it is possible to appropriately apply a voltage to the pixel electrodes 9a or to hold the potential-retaining properties of the pixel electrodes 9a satisfactorily.

Furthermore, since the shielding layer 400 and third junction electrodes 402 contain aluminum having a relatively excellent light reflecting property and titanium nitride having a relatively excellent light absorbing property, the shielding layer 400 and third junction electrodes 402 can function as light-shielding layers. That is, according to this configuration, light incident on the semiconductor layers 1a of the TFTs 30 (see FIG. 4) can be blocked above the semiconductor layers 1a of the TFTs 30. In the above-mentioned capacitor electrodes 300 and data lines 6a, the same advantage as this can be obtained. In this exemplary embodiment, the shielding layer 400, third junction electrodes 402, capacitor electrodes 300, and data lines 6a form part of the layered structure disposed on the TFT array substrate 10 and can function as upper light-shielding layers to shield the TSTs 30 against light entering from the upper side. The upper light-shielding layers may be referred to as "built-in light-shielding layers" because the shielding layer 400, third junction electrodes 402, capacitor electrodes 300, and data lines 6a are components of the layered structure. Incidentally, according to this concept, the "upper light-shielding layers", or the "built-in light-shielding layers" also include the gate electrodes 3a and lower electrodes 71 in addition to the above components. Under the broadest definition, any component, placed on the TFT array substrate 10, including an opaque material may be referred to as the "upper light-shielding layers", or the "built-in light-shielding layers".

The third interlayer insulating layer 43 is placed on the above-mentioned data lines 6a and placed under the shielding layer 400. The third interlayer insulating layer 43 contain silicate glass, such as NSG, PSG, BSG or BPSG; silicon nitride; or silicon dioxide. The third interlayer insulating layer 43 used herein is preferably formed by a plasma CVD process using TEOS gas. The third interlayer insulating layer 43 has ninth contact holes 803, extending therethrough, each electrically connecting the shielding layer 400 to the corresponding first junction electrodes 6a1 and sixth contact holes 804, extending therethrough, each electrically connecting the corresponding third junction electrodes 402 to the corresponding second junction electrodes 6a2.

In contrast to the first interlayer insulating layer 41, the second interlayer insulating layer 42 may not be subjected to firing so as to ease stress occurring in the interfaces between the capacitor electrodes 300 and second interlayer insulating layer 42.

Finally, in the sixth level, the pixel electrodes 9a are arranged in a matrix and the first alignment layer 16 is disposed thereon. The fourth interlayer insulating layer 44 is disposed under the pixel electrodes 9a. The fourth interlayer insulating layer 44 contains silicate glass, such as NSG PSG, BSG, or BPSG; silicon nitride; silicon dioxide; or the like, and preferably contains BPSG The fourth interlayer insulating layer 44 has the eighth contact holes 89, extending therethrough, each electrically connecting the pixel electrodes 9a to the third junction electrodes 402. Particularly in this exemplary embodiment, the surface of the fourth interlayer insulating layer 44 is planarized by a chemical mechanical polishing (CMP) process or the like, whereby misorientation of the liquid layer 50 due to steps can be reduced, the steps being caused by various wiring lines and/or elements disposed under the fourth interlayer insulating layer 44. However, instead of or in addition to such planarization of the fourth interlayer insulating layer 44, may be formed in at least one of the, TFT array substrate 10, base insulating layer 12, first interlayer insulating layer 41, second interlayer insulating layer 42, and third interlayer insulating layer 43, to bury the TFTs 30 and wiring lines, such as the data lines 6a therein.

In this exemplary embodiment, the electro-optical device having the above configuration is characterized in that the second level includes the lower junction electrodes 719 formed using the same film as that for forming the gate electrodes 3a, and the lower electrodes 71 of the storage capacitors 70 located in the third level are each electrically connected to the corresponding pixel electrodes 9a located in the sixth level with the corresponding lower junction electrodes 719.

As described above, the lower electrodes 71 and the pixel electrodes 9a are electrically connected to each other with the lower junction electrodes 719 located below the lower electrodes 71 and pixel electrodes 9a. Thus, electrical contacts of the lower junction electrodes 719 and the lower electrodes 71, especially the electrical contacts of the lower electrodes 71 are located below the lower electrodes 71 when focused the positions of the lower electrodes 71 (see the third contact holes 881 shown in FIG. 4).

Figure 5:
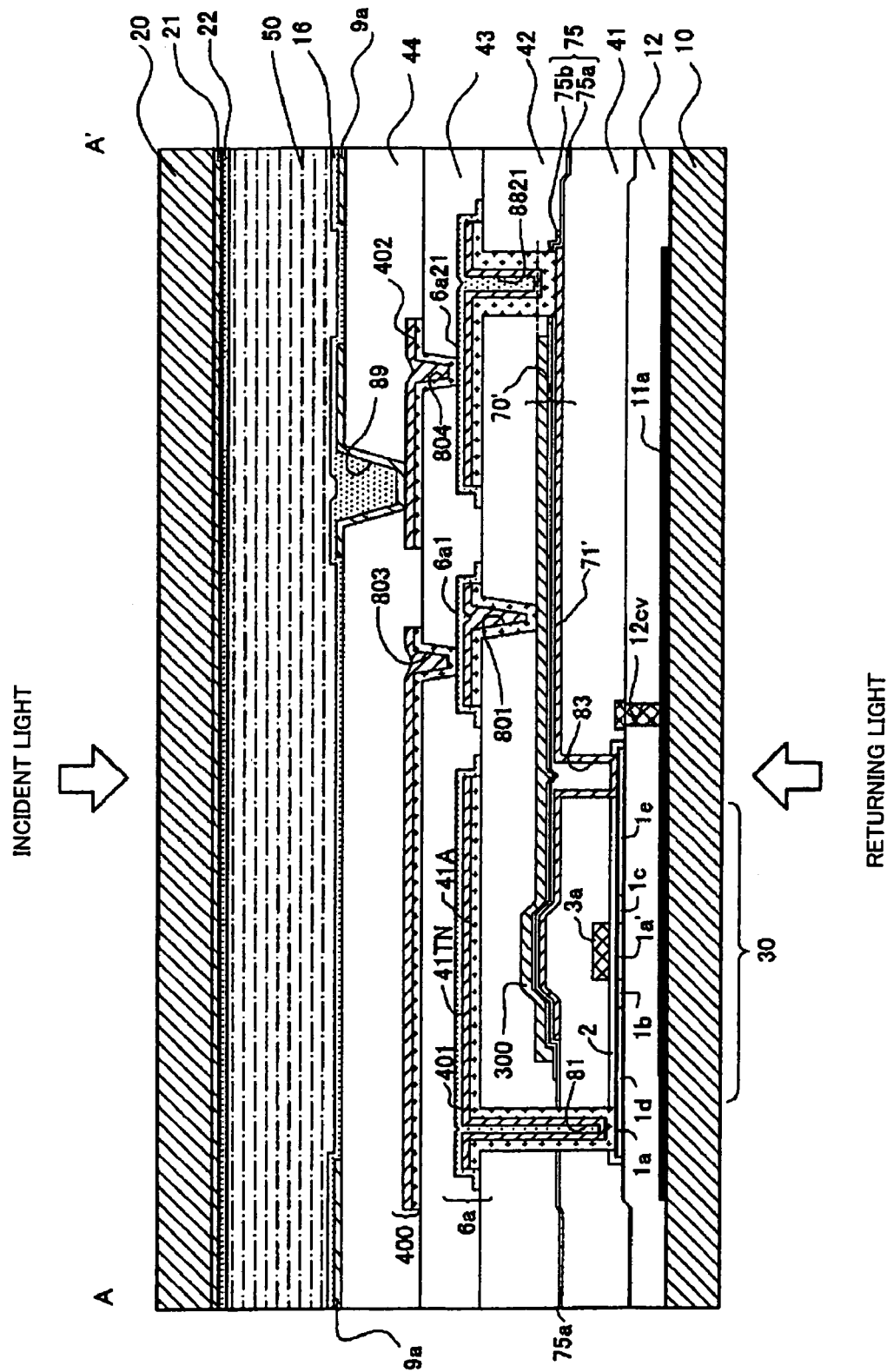
FIG. 5 is a fragmentary sectional view showing a configuration to be compared with that shown in FIG. 4.

Since the electro-optical device of this exemplary embodiment has the above configuration, advantages described below can be obtained. Such advantages can be made clear by comparing the present electro-optical device with a comparative electro-optical device having a configuration different from the above-mentioned configuration. The comparison is made below with reference to FIG. 5. FIG. 5 is a sectional view showing the comparative electro-optical device to be compared with the present electro-optical device shown in FIG. 4. In order to facilitate description, the substantially same components shown in FIG. 5 as those shown in FIG. 4. have the same reference numerals as those of the components shown in FIG. 4. The comparative electro-optical device is merely used for the comparison with the electro-optical device according to the exemplary embodiment described above and is within the scope of the present invention.

First of all, with reference to FIG. 4, as described above, the lower electrodes 71 and lower junction electrodes 719 are electrically connected to each other through the third contact holes 881 extending through the first interlayer insulating layer 41 disposed between the lower electrodes 71 and lower junction electrodes 719. Thus, the electrical contacts of the lower junction electrodes 719 and the lower electrodes 71 are located "below" the lower electrodes 71.

In contrast, with reference to FIG. 5, there are no lower junction electrodes 719; hence, comparative lower electrodes 71' and the pixel electrodes 9a are electrically connected to each other through comparative contact holes 8821 having electrical contacts disposed above the comparative lower electrodes 71'. In particular, the comparative contact holes 8821 extend through the second interlayer insulating layer 42 and the dielectric layers 75, and comparative second junction electrodes 6a21 are formed on the second interlayer insulating layer 42 and fill the comparative contact holes 8821. A configuration located above these components is substantially the same as that shown in FIG. 4.

In the comparative electro-optical device having the above configuration, in order to electrically connect the comparative lower electrodes 71' to the respective pixel electrodes 9a, regions located above the comparative lower electrodes 71' must be used, as is clear from FIG. 5. Furthermore, in order to form such a configuration, "only" the dielectric layers 75 and the capacitor electrodes 300, which are components of comparative storage capacitors 70', must be etched in this case (see the areas indicated by the broken lines in FIG. 5). This is because the surfaces of the comparative lower electrodes 71' must be exposed when viewed from above in order to electrically connect the comparative lower electrodes 71' and pixel electrodes 9a each other.

However, such etching treatment is difficult, because the comparative lower electrodes 71' and dielectric layers 75 usually have a thickness as small as possible. Furthermore, in this exemplary embodiment, the dielectric layers 75 each include the corresponding silicon nitride films and the like, and therefore the silicon dioxide films are thinner by that much. When, for example, the capacitor electrodes 300 include polysilicon, tungsten silicide or stacked layer thereof, the capacitor electrodes 300 can be etched by setting the etching rate of the silicon dioxide films included in the dielectric layers 75 considerably smaller than that of the capacitor electrodes 300 to stop the etching on the dielectric layers 75. However, the dielectric layers 75 are penetrated by etching and the pixel potential capacitor electrodes are also easily etched when the silicon dioxide films included in the dielectric layers 75 have a small thickness. Thus, in this configuration, so-called "penetrations" or the like are probably caused in the comparative lower electrodes 71'. Therefore, there is a problem in that the capacitor electrodes 300 and comparative lower electrodes 71', which are components of the storage capacitors 70, are short-circuited at the worst.

However, in this exemplary embodiment, such a difficult etching step is not necessary, as shown in FIG. 4, and therefore the lower electrodes 71 can be each electrically connected to the corresponding pixel electrodes 9a securely. The lower electrodes 71 and pixel electrodes 9a are electrically connected to each other with the corresponding lower junction electrodes 719. Furthermore, in this exemplary embodiment, for the same reason as the above, the capacitor electrodes 300 and lower electrodes 71 are hardly short-circuited. Thus, the storage capacitors 70 having no defects can be preferably formed.

As described above, in this exemplary embodiment, the storage capacitors 70 can be electrically connected to the pixel electrodes 9a securely and the risk that the storage capacitors 70 have defects is greatly reduced. Thus, the electro-optical device which operates much better can be obtained.

In this exemplary embodiment, the lower junction electrodes 719 are formed using the same film used to form the gate electrodes 3a; however, the present invention is not limited to this exemplary embodiment. For example, the third level includes the storage capacitors 70 in this exemplary embodiment; however, another layer disposed above the third level may include the storage capacitors 70 according to needs. In such a case, the lower junction electrodes 719 may be disposed in an upper level relative to the gate electrodes 3a. For the two- or three-dimensional arrangement of the various components of the electro-optical device, the present invention is not limited to the above-mentioned exemplary embodiment. Various arrangements thereof different from those shown in FIGS. 1 to 4 may be employed.

In this exemplary embodiment, the storage capacitors 70 have the triple layer structure including each pixel potential capacitor electrode, dielectric layer, and constant potential capacitor electrode disposed in this order from the bottom; however, these components may be disposed in an order reverse to the above order according to needs. In this configuration, the pixel potential capacitor electrode, functioning as an upper electrode, preferably has an area larger than that of the constant potential capacitor electrode. For example, the pixel potential capacitor electrode preferably has a region extending out of the constant potential capacitor electrode in plan view. The extending region is preferably disposed corresponding to a region to form a contact hole extending to the lower junction electrode 719. According to this configuration, the lower junction electrode 719 can be electrically connected to the pixel potential capacitor electrode readily through this contact hole.

Thus, the "pixel potential capacitor electrodes" specified herein need not constitute the "lower" electrodes 71 of the storage capacitors 70 as described in this exemplary embodiment, but may constitute the upper electrodes thereof.

Manufacturing Process

A process to manufacture an electro-optical device similar to the above exemplary embodiment will now be described with reference to FIGS. 6 and 7. FIGS. 6 and 7 each include sectional views showing steps of manufacturing the electro-optical device according to this exemplary embodiment step by step.

Figure 6A:
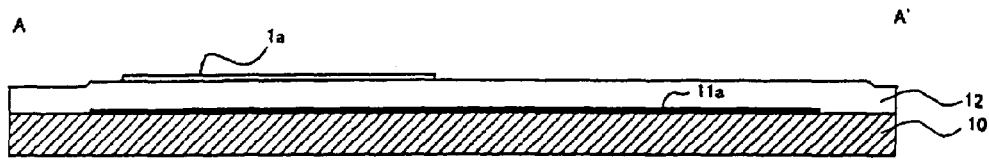
FIGS. 6(A)–6(E) are first schematics including sectional views showing steps of manufacturing the electro-optical device step by step.

As shown in (FIG. 6(A), the TFT array substrate 10 containing quartz, hard glass, or silicon is prepared. The TFT array substrate 10 is then pretreated. For example, the TFT array substrate 10 is preferably annealed at a high temperature ranging from about 900 to 1,300° C. in an inert gas atmosphere preferably, such as nitrogen ($N_2$), so as to decrease deformation of the TFT array substrate 10 caused in subsequent steps at a high temperature.

A first precursor film is formed over the entire surface of the resulting TFT array substrate 10 by a sputtering process. The first precursor film contains a metal, such as Ti, Cr, W, Ta, or Mo; or metal alloy, such as a metal silicide containing such metals as described above and has a thickness of about 100 to 500 nm, preferably 200 nm. The first precursor film is then subjected to photolithography and etching, thereby forming the scanning lines 11a arranged in a striped pattern when viewed from above. The base insulating layer 12 is formed on the scanning lines 11a by an atmospheric or vacuum CVD process or the like using tetraethyl orthosilicate (TEOS) gas, tetraethyl borate (TEB) gas, or trimethyl orthophosphate (TMOP) gas. The base insulating layer 12 has a thickness of about 500 to 2,000 run and contains silicate glass, such as nondoped silicate glass (NSG), phosphorus silicate glass (PSG), boron silicate glass (BSG), or boron phosphorus silicate glass (BPSG); silicon nitride; or silicon dioxide.

Then, an amorphous silicon layer is formed on the base insulating layer 12 at a relatively low temperature ranging from 450 to 550° C., preferably about 500° C. (at a pressure of about 20 to 40 Pa) by a vacuum CVD process using monosilane gas or disilane gas. The flow rate of the monosilane or disilane gas is about 400 to 600 cc/min. The amorphous silicon layer is then heat-treated for about 1 to 10 hours, preferably 4 to 6 hours, at about 600 to 700° C. in a nitrogen gas atmosphere, whereby a polysilicon (p-Si) layer having a thickness of about 50 to 200 nm, preferably about 100 nm, is formed by solid phase epitaxy. The solid phase epitaxy may be carried out by an annealing process using RTA or by a laser annealing process using excimer laser or the like. The polysilicon layer may be then slightly doped with a dopant, such as a group V element or a group III element by ion implantation depending on the type of the TFTs 30 for switching pixels: an n-channel type or a p-channel type. The polysilicon layer is subjected to photolithography and etching, whereby the semiconductor layers 1a are formed in a predetermined pattern.

Figure 6B:
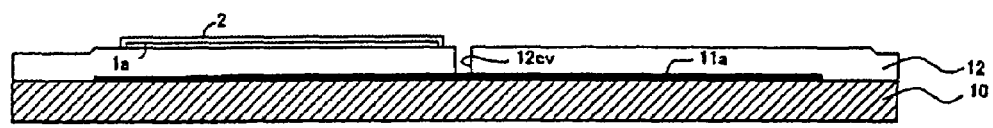

Next, as shown in FIG. 6(B), the semiconductor layers 1a included in the TFTs 30 are thermally oxidized at a temperature of about 900 to 1,300° C., preferably about 1,000° C., thereby forming lower gate-insulating sub-layers. Upper gate-insulating sub-layers may be subsequently each formed on the corresponding lower gate-insulating sub-layers by a vacuum CVD process or the like, if necessary. Thereby, insulating layers 2 that have a single- or multi-layer structure and contain high temperature oxide (HTO) and/or silicon nitride are formed (the insulating layers 2 include the above gate-insulating sub-layers). As a result, the semiconductor layers 1a have a thickness of about 30 to 150 nm and preferably 35 to 50 nm. The insulating layers 2 have a thickness of about 20 to 150 nm and preferably 30 to 100 nm.

In order to control the threshold voltage $V_{th}$ of the TFTs 30 to switch the pixels, n-channel regions or p-channel regions of the semiconductor layers 1a are doped with a predetermined amount of dopant, such as boron by ion implantation or the like.

Then, the slots 12cv extending to the scanning lines 11a are formed in the base insulating layer 12 by a dry etching process, such as a reactive ion etching process or a reactive ion beam etching process.

Figure 6C:
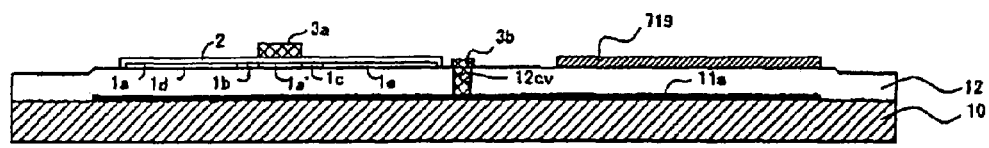

As shown in FIG. 6(C), a polysilicon layer is deposited over the base insulating layer 12 by a vacuum CVD process or the like, and phosphorus (P) is thermally diffused in the polysilicon layer, thereby rendering the polysilicon layer conductive. Alternatively, P ions may be introduced into the polysilicon layer during the formation thereof instead of the thermal diffusion, thereby forming a doped polysilicon layer. The polysilicon layer preferably has a thickness of about 100 to 500 nm and preferably about 350 nm. The resulting polysilicon layer is then subjected to photolithography and etching, thereby forming the gate electrodes 3a, arranged in a predetermined pattern, including gate electrode portions for the TFTs 30. According to the manufacturing process of the invention, when the gate electrodes 3a are formed, the side walls 3b extending from the gate electrodes 3a are simultaneously formed. The side walls 3b are formed by depositing the polysilicon layer in the slots 12cv. In this case, since the bottoms of the slots 12cv are in contact with the corresponding scanning lines 11a, the side walls 3b are each electrically connected to the corresponding scanning lines 11a. Furthermore, according to the manufacturing process, the lower junction electrodes 719 are also formed during the formation of the gate electrodes 3a. Thereby, the lower junction electrodes 719 are arranged in a two-dimensional pattern shown in FIG. 2.

The following regions are then each formed in the corresponding semiconductor layers 1a: the lightly doped source regions 1b, lightly doped drain regions 1c, heavily doped source regions 1d, and heavily doped drain regions 1e.

A procedure to form the TFTs 30 that are of an n-channel type and have an LDD structure is described below. In order to form the lightly doped source regions 1b and lightly doped drain regions 1c, the semiconductor layers 1a are doped with a dopant of a group V element, such as P at a small dose using the gate electrodes 3a as masks (for example, P ions are implanted at a dose of $1 \times 10^{13}$ to $3 \times 10^{13}/cm^2$). Thereby, a portion of each semiconductor layer 1a disposed below each gate electrode 3a is transformed into a channel region 1a'. In this procedure, the lightly doped source regions 1b and lightly doped drain regions 1c are formed in a self-aligned manner because the gate electrodes 3a function as masks.

Next, in order to form the heavily doped source regions 1d and heavily doped drain regions 1e, a resist layer having line portions having a width larger than that of the gate electrodes 3a is formed over the gate electrodes 3a. In such a state, the semiconductor layers 1a are doped with a dopant of a group V element, such as P at a high dose (for example, P ions are implanted at a dose of $1 \times 10^{15}$ to $3 \times 10^{15}/cm^2$).

The semiconductor layers 1a need not be doped in two steps, low dose implantation and high dose implantation. For example, TFTs having offset structure may be formed without performing the low dose implantation. Alternatively, TFTs having self-aligned structure may be formed by the implantation of ions, such as P or B ions using the gate electrodes 3a as masks. The resistance of the gate electrodes 3a is further decreased by the implantation of these impurity ions.

Figure 6D:
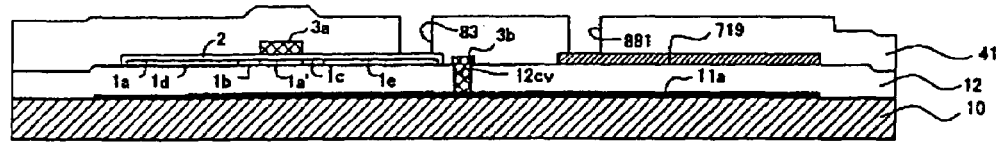

Next, as shown in (FIG. 6(D)), the first interlayer insulating layer 41 is formed over the gate electrodes 3a by an atmospheric or vacuum CVD process using TEOS gas, TEB gas, or TMOP gas or the like. The first interlayer insulating layer 41 contains silicate glass, such as NSG PSG, BSG, or BPSG; silicon nitride; or silicon dioxide and has a thickness of about 500 to 2,000 nm. The first interlayer insulating layer 41 is preferably annealed at a high temperature, for example, about 800° C., thereby enhancing properties thereof.

The second contact holes 83 and third contact holes 881 are formed in the first interlayer insulating layer 41 by a dry etching process, such as a reactive ion etching process or a reactive ion beam etching process. In this case, the second contact holes 83 each extend to the corresponding heavily doped drain regions 1e, and the third contact holes 881 extend to the corresponding lower junction electrodes 719.

Figure 6E:
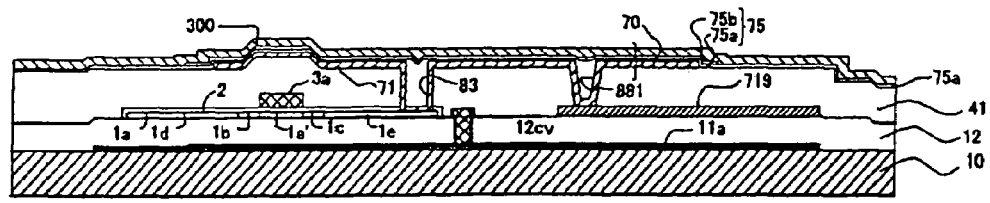

As shown in FIG. 6(E), a second precursor film for the lower electrodes 71 having a thickness of about 100 to 500 nm and a predetermined pattern is formed on the first interlayer insulating layer 41 by sputtering Pt or the like. In this case, the second precursor film is formed such that the second contact holes 83 and third contact holes 881 are filled with such metal film. Thereby, the lower electrodes 71 are each electrically connected to the corresponding heavily doped drain regions 1e and lower junction electrodes 719. The second precursor film is then etched, thereby forming the lower electrodes 71.

Subsequently, the dielectric layers 75 are each provided on the corresponding lower electrodes 71 according to the procedure below. Like in the case of the insulating layers 2, the dielectric layers 75 can be formed by any suitable process generally used to form TFT gate insulating layers. In this exemplary embodiment, first, the silicon dioxide sub-layer 75a is formed by the above-mentioned thermal oxidation process, CVD process, or the like, and then, the silicon nitride sub-layers 75b are formed thereon by a plasma CVD process or the like. Since the capacitance of the storage capacitors 70 becomes larger as the dielectric layers 75 become thinner, the dielectric layers 75 are preferably formed to have a small thickness, for example, a thickness of 50 nm or less, as long as the dielectric layers 75 are not broken. Then, a fourth precursor film, having a thickness of about 100 to 500 nm, to form capacitor electrodes 300 is formed on the dielectric layers 75 by sputtering a metal, such as Al.

Figure 7A:
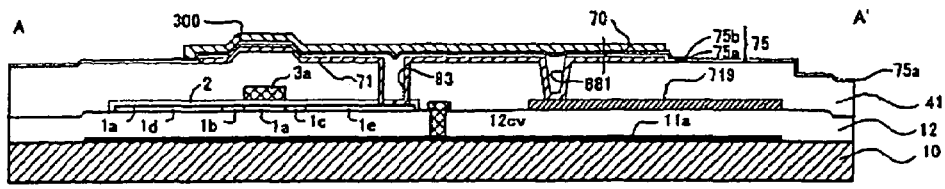
FIGS. 7(A)–7(D) are second schematics including sectional views showing steps of manufacturing the electro-optical device step by step.

As shown in FIG. 7(A), the silicon dioxide sub-layer 75a is not etched but the third precursor film for the silicon nitride sub-layers 75b is etched such that the silicon nitride sub-layers 75b have a size slightly larger than that of the lower electrodes 71 of the pixel potential capacitor electrodes. Furthermore, the fourth precursor film for the capacitor electrodes 300 is then etched such that the capacitor electrodes 300 have substantially the same size as that of the lower electrodes 71. In such a configuration, based on the formation of the capacitor electrodes 300, the portions each disposed between the corresponding capacitor electrodes 300 and lower electrodes 71 substantially correspond to the dielectric layers 75 (see FIG. 4).

Alternatively, in FIG. 7(A), the third precursor film to form the silicon nitride sub-layers 75b and the fourth precursor film to form the capacitor electrodes 300 may be etched in one step to form the dielectric layers 75 and capacitor electrodes 300, and to thereby obtain the storage capacitors 70.

As described above, in this exemplary embodiment, the storage capacitors 70 are formed such that the capacitor electrodes 300 functioning as the constant potential capacitor electrodes have an area larger than that of the dielectric layers 75 and that of the lower electrodes 71 functioning as the pixel potential capacitor electrodes. Therefore, the dielectric layers 75 are in contact with the capacitor electrodes 300 with a large area. In particular, sides of the three components of each storage capacitor 70 can be used as capacitor portions. Thus, it can be expected that the storage capacitors 70 have a larger capacitance. Namely, according to this exemplary embodiment, the storage capacitors 70 having a relatively large capacitance, but no wasted area, can be formed without decreasing the pixel aperture ratio. Therefore, from this point of view, if the lower electrodes 71 are formed relatively thick, the area of the sides is increased, thereby enhancing the capacitance effectively. As is clear from the figure, according to this configuration, the dielectric layers 75 each cover the corresponding lower electrodes 71, and therefore the risk that capacitor electrode 300 and lower electrode 71 are short-circuited can be reduced.

Furthermore, according to this exemplary embodiment, since etching is performed as described above, the following difficult technique is not necessary in contrast to known methods: only the capacitor electrodes 300 and dielectric layers 75 are etched while the lower electrodes 71 located below are remained as they are. Thus, according to an aspect of the present invention, reliable storage capacitors can be readily manufactured.

Figure 7B:
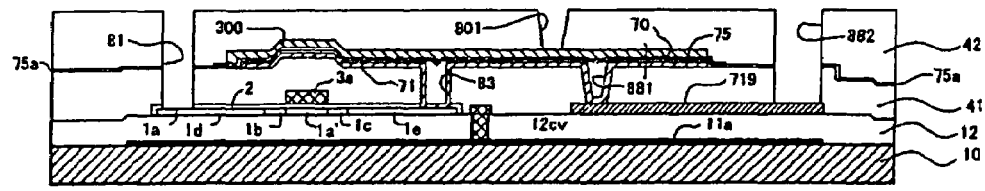

As shown in FIG. 7(B), the second interlayer insulating layer 42 is formed by an atmospheric or vacuum CVD process, preferably by a plasma CVD process, using, for example, TEOS gas or the like. The second interlayer insulating layer 42 contains silicate glass, such as NSG PSG, BSG or BPSG; silicon nitride; or silicon dioxide. When the capacitor electrodes 300 contain aluminum, the second interlayer insulating layer 42 must be formed at a low temperature by a plasma CVD process. The second interlayer insulating layer 42 has a thickness of about 500 to 1,500 nm. Then, the first contact holes 81, seventh contact holes 801, and fourth contact holes 882 are formed in the second interlayer insulating layer 42 by a dry etching process, such as a reactive ion etching process or a reactive ion beam etching process. In this case, the first contact holes 81 each extend to the corresponding heavily doped source regions 1d of the semiconductor layers 1a, the seventh contact holes 801 each extend to the corresponding capacitor electrodes 300, and the fourth contact holes 882 each extend to the corresponding lower junction electrodes 719.

Figure 7C:
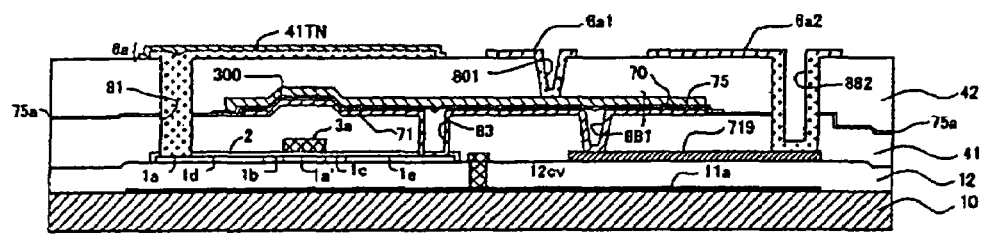

As shown in FIG. 7(C), a fifth precursor film is formed on the entire surface of the second interlayer insulating layer 42 by a sputtering process or the like. The fifth precursor film contains light-shielding and low resistant metal, such as aluminum, metal silicide or the like and has a thickness of about 100 to 500 nm, preferably about 300 nm. The fifth precursor film is subjected to photolithography and etching to form the data lines 6a having a predetermined pattern. In this etching step, the first junction electrodes 6a1 and second junction electrodes 6a2 are also simultaneously formed. The first junction electrodes 6a1 each cover the corresponding seventh contact holes 801, and the second junction electrodes 6a2 each cover the corresponding fourth contact holes 882. A titanium nitride film is then formed over these components by a plasma CVD process or the like, and is etched such that the titanium nitride film remains only on the data lines 6*a* (see reference numeral 41TN shown in FIG. 7(C)). However, the titanium nitride film may remain on the corresponding first junction electrodes 6*a*1 and second junction electrodes 6*a*2 and the titanium nitride film may remain over the entire surface of the TFT array substrate 10. The titanium nitride film and the fifth precursor film containing aluminum may be formed simultaneously, and subjected to etching in one step. (In this case, an obtained configuration is somehow different from that shown in FIG. 4.)

Figure 7D:
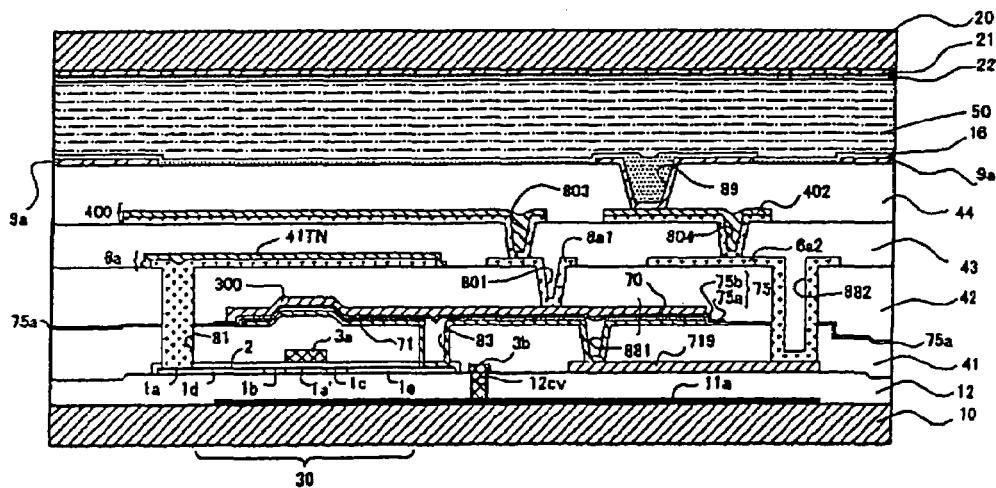

As shown in FIG. 7(D), the third interlayer insulating layer 43 is formed to cover the data lines 6*a* and the like by an atmospheric or vacuum CVD process using, for example, TEOS gas or the like, preferably by a plasma CVD process which allows film formation at a low temperature. The third interlayer insulating layer 43 contains silicate glass, such as NSG, PSG, BSG, or BPSG, silicon nitride, silicon dioxide or the like, and has a thickness of about 500 to 1,500 nm. The ninth contact holes 803 and sixth contact holes 804 are formed in the third interlayer insulating layer 43 by a dry etching process, such as a reactive ion etching process or a reactive ion beam etching process. The ninth contact holes 803 are formed to lead to the corresponding first junction electrodes 6*a*1, and the sixth contact holes 804 are formed to lead to the corresponding second junction electrodes 6*a*2.

A shielding layer 400 is formed on the resulting third interlayer insulating layer 43 by a sputtering process, plasma CVD process or the like. The forming procedure is as follows: first, a first sub-layer containing a material, such as aluminum, having a small resistance is formed; secondly, a second sub-layer is formed on the first sub-layer, the second sub-layer containing titanium nitride or a material which does not generate galvanic corrosion with ITO constituting the pixel electrodes 9*a* described below; and finally, the first and second sub-layers are etched together, thereby obtaining the shielding layer 400 having a double layer structure. In this case, third junction electrodes 402 are formed simultaneously with the shielding layer 400.

Then, the fourth interlayer insulating layer 44 is formed by an atmospheric or vacuum CVD process using, for example, TEOS gas or the like. The fourth interlayer insulating layer 44 contains silicate glass, such as NSG, PSG, BSG, or BPSG; silicon nitride, silicon dioxide or the like, and has a thickness of about 500 to 1,500 nm. The eighth contact holes 89 are formed in the fourth interlayer insulating layer 44 by a dry etching process, such as a reactive ion etching process or a reactive ion beam etching process. In this case, the eighth contact holes 89 each extend to the corresponding third junction electrodes 402.

A transparent conductive layer, containing ITO or the like, having a thickness of about 50 to 200 nm is formed on the fourth interlayer insulating layer 44 by a sputtering process or the like. The obtained transparent conductive layer is then subjected to photolithography and etching, thereby forming the pixel electrodes 9*a*. When the electro-optical device is of a reflective type, the pixel electrodes 9*a* may be formed using an opaque material, such as Al, having high reflectance. A polyimide solution to form alignment layers is applied over the pixel electrodes 9*a* and then rubbed in a predetermined direction so as to have a predetermined pretilt angle, thereby obtaining the first alignment layer 16.

On the other hand, with respect to the counter substrate 20, a glass plate or the like is firstly prepared, and a metal layer containing, for example, chromium is formed on the counter substrate 20 by a sputtering process. The metal layer is subjected to photolithography and etching, thereby forming a light-shielding layer functioning as a frame. The light-shielding layer need not be conductive and may contain a metal, such as Cr, Ni, or Al; resin black having carbon or Ti dispersed in a photoresist; or the like.

Next, a transparent conductive layer, containing ITO or the like, having a thickness of about 50 to 200 nm is formed on the entire surface of the counter substrate 20 by a sputtering process or the like, thereby obtaining the counter electrode 21. A polyimide solution to form alignment layers is applied to the entire surface of the counter electrode 21 and then rubbed in a predetermined direction so as to have a predetermined pretilt angle, thereby obtaining the second alignment layer 22.

Finally, the resulting counter substrate 20 is joined to the TFT array substrate 10 having the above-mentioned layers thereon with the sealing member 52 such that the second alignment layer 22 faces the first alignment layer 16. Liquid crystal, a mixture of a plurality of nematic liquid crystals is provided in a space between the substrates by vacuum aspiration or the like, thereby obtaining the liquid crystal layer 50 having a predetermined thickness.

According to the manufacturing steps described above, the electro-optical device of this exemplary embodiment can be obtained.

In the above description, the storage capacitors 70 are formed by firstly forming the lower electrodes 71, and then forming dielectric layers 75, and capacitor electrodes 300, however, it is possible that the second precursor film to form the lower electrodes 71, a sixth precursor film to form the dielectric layers 75, and the fourth precursor film to form the capacitor electrodes 300 are formed in this order and then etched in one step instead of the above procedure, thereby obtaining the storage capacitors 70.

Entire Configuration of Electro-Optical Device

Figure 8:
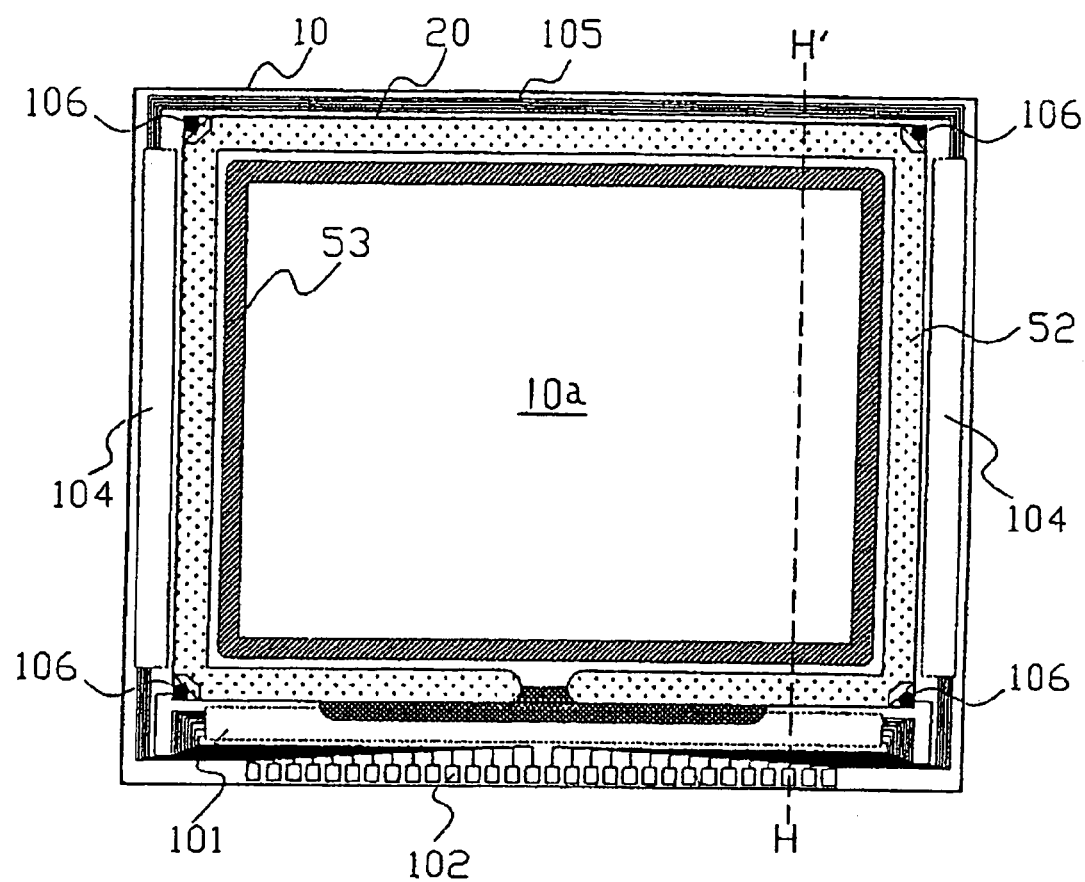
FIG. 8 is a plan view showing a TFT array substrate, included in the electro-optical device according to an exemplary embodiment of the present invention, having various components thereon, when viewed from a counter substrate.
Figure 9:
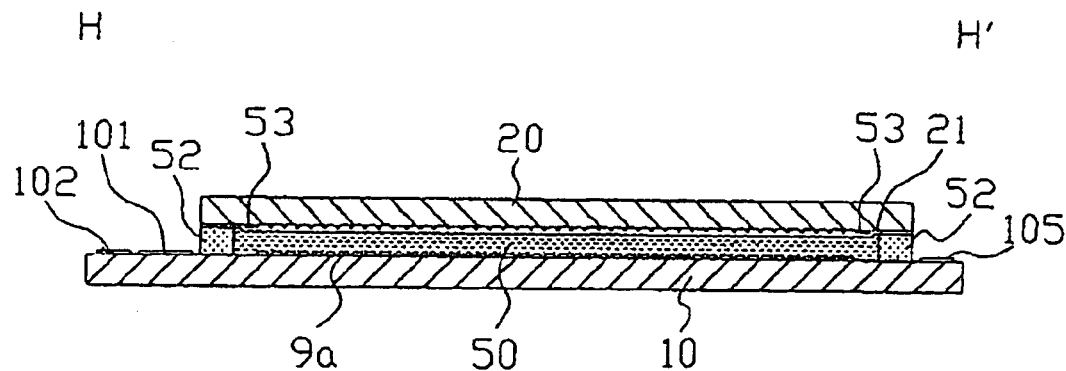
FIG. 9 is a sectional view taken along the plane H–H' of FIG. 8.

The entire configuration of the electro-optical device according to this exemplary embodiment will now be described with reference to FIGS. 8 and 9. FIG. 8 is a plan view showing the TFT array substrate 10 having various components thereon when viewed from the counter substrate 20 side. FIG. 9 is a sectional view showing taken along the plane H–H' of FIG. 8.

With reference to FIGS. 8 and 9, the electro-optical device of this exemplary embodiment includes the TFT array substrate 10 and counter substrate 20 facing the TFT array substrate 10. The liquid crystal layer 50 is disposed between the TFT array substrate 10 and counter substrate 20 in a sealed manner. The TFT array substrate 10 and counter substrate 20 are joined to each other with the sealing member 52 placed in a sealing region surrounding the image display region 10*a*.

The sealing member 52 contains a UV curable resin, thermosetting resin or the like, and is cured by UV rays, heat or the like when the substrates are joined to each other. The sealing member 52 further contains gap members (spacers), such as glass fibers or glass beads, for keeping the distance between the substrates at a predetermined value when the electro-optical device of this exemplary embodiment is used for small-sized liquid crystal devices, such as projectors, to display an image in an enlarged manner. Alternatively, such gap members may be contained in the liquid crystal layer 50 when the electro-optical device is used for large-sized liquid crystal devices, such as liquid crystal displays or liquid crystal TVs, to display an image at 1× magnification.

In an area outside the sealing member 52, an external circuit-connecting terminals 102 and a data line-driving circuit 101 to drive the data lines 6*a* by transmitting image signals to the data lines 6*a* at a predetermined timing are arranged along a side of the TFT array substrate 10. A scanning line-driving circuit 104 to drive the gate electrodes 3a by transmitting scanning signals to the scanning lines 11a and the gate electrodes 3a at a predetermined timing is arranged along the two sides adjacent to the above-mentioned side, respectively.

When a delay in transmitting the scanning signals transmitted to the scanning lines 11a and gate electrodes 3a do not cause any problem, it is understood that the scanning line-driving circuit 104 may be placed along only one side. The data line-driving circuit 101 may be placed on both sides of the image display region 10a.

A plurality of wiring lines 105 to connect the scanning line-driving circuits 104, placed on both sides of the image display region 10a, are arranged along the remaining one side of the TFT array substrate 10.

A conductive member 106 to electrically connect the TFT array substrate 10 to the counter substrate 20 is placed in at least one corner of the counter substrate 20.

With reference to FIG. 9, the TFTs 30 to switch pixels and wiring lines, such as the scanning lines 11a and the data lines 6a, are arranged above the TFT array substrate 10. The pixel electrodes 9a are arranged above the TFTs 30 and wiring lines. The first alignment layer 16 is placed above the pixel electrodes 9a. On the other hand, the counter electrode 21 and second alignment layer 22, which is the uppermost layer, are placed on the counter substrate 20. The liquid crystal layer 50 contains a mixture containing one or more kinds of nematic liquid crystals and takes a predetermined alignment state between a pair of the alignment layers 16 and 22. In the liquid crystal layer 50, predetermined alignment is maintained.

On the TFT array substrate 10, in addition to the data line-driving circuit 101, scanning line-driving circuits 104 and the like, there may be provided a sampling circuit to transmit image signals to a plurality of the data lines 6a at a predetermined timing, a precharge circuit to transmit precharge signals having a predetermined voltage level to the data lines 6a prior to the image signals, and an inspection circuit to inspect the quality and/or defects of the electro-optical device in manufacturing steps and/or at the time of delivery, or the like.

In the above-mentioned exemplary embodiments, instead of placing the data line-driving circuit 101 and scanning line-driving circuits 104 on the TFT array substrate 10, the above components and lines may be electrically and mechanically connected to, for example, a driving LSI mounted on a tape automated bonding (TAB) substrate through an anisotropic conductive film provided in the periphery portion of the TFT array substrate 10. Furthermore, polarizing films, retardation films, polarizers, or the like are each placed, in a predetermined orientation, on a surface of the counter substrate 20 on which projected light is incident and a surface of the TFT array substrate 10 from which outgoing light is emitted depending on a display mode, such as a normally white mode or normally black mode and an operating mode, such as a twisted nematic (TN) mode, vertically aligned (VA) mode, or polymer-dispersed liquid crystal (PDLC) mode.

Electronic Apparatus

Figure 10:
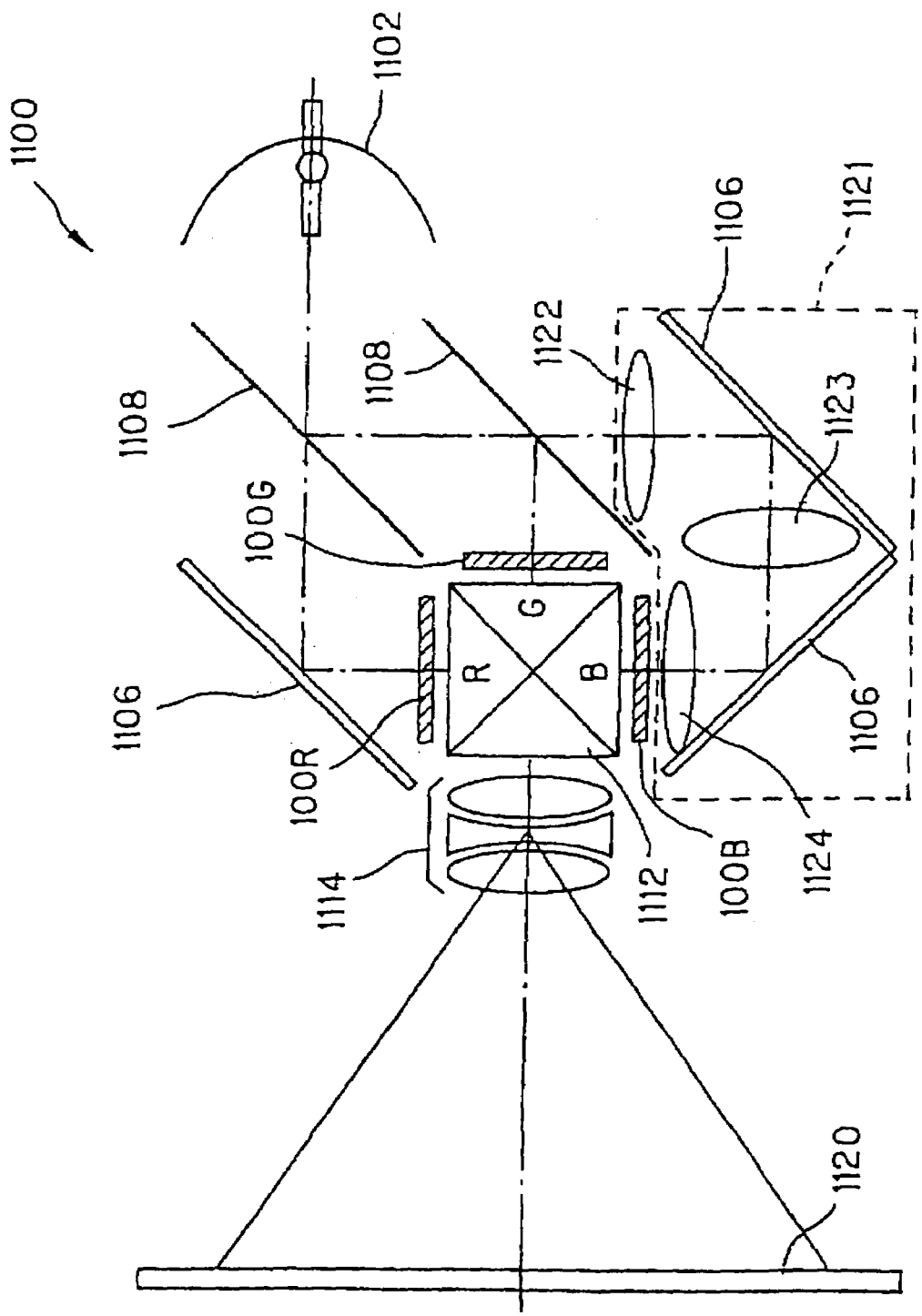
FIG. 10 is a schematic sectional view showing a liquid crystal projector, which is an example of a projective color display unit included in an electronic apparatus according to an exemplary embodiment of the present invention.

The entire configuration, especially optical configuration of a color display projector, which is an example in which the electro-optical device of an aspect of the present invention is used as a light bulb, will now be described. FIG. 10 is a schematic sectional view showing the color display projector.

FIG. 10 shows a liquid crystal projector 1100, which is an example of a projector type color display device according to this exemplary embodiment. The liquid crystal projector 1100 includes three liquid crystal modules, each being used as a red light valve 100R, a green light valve 100G, and a blue light valve 100B. These light valves each include a liquid crystal device including a TFT array substrate and a driving circuit mounted thereon. The liquid crystal projector 1100 further includes a lamp unit 1102 as a white light source, such as a metal halide lamp; three mirrors 1106; two dichroic mirrors 1108; a relay lens system 1121 including an entrance lens 1122, a relay lens 1123, and an emitting lens 1124; a dichroic prism 1112; and a projecting lens 1114. The lamp unit 1102 emits light, which is divided into red, green, and blue light components R, G, and B corresponding to the three primary colors. The red, green, and blue light components R, G, and B are each transmitted to the corresponding red, green, and blue light valves 100R, 100G and 100B. In particular, in order to reduce an optical loss due to long optical path, the blue light component B is guided through the relay lens system 1121. The red, green, and blue light components R, G and B are each modulated with the corresponding red, green, and blue light valves 100R, 100G and 100B and are then combined into one light ray by the dichroic prism 1112. The light ray is projected onto a screen 1120 through the projecting lens 1114, thereby displaying a color image.

The present invention is not limited to the above exemplary embodiments, and various modifications may be made within the scope and spirit of the present invention specified in the specification and claims. The present invention is intended to cover modified electro-optical devices, manufacturing process thereof, and electronic apparatus. The electro-optical device of an aspect of the present invention can be used for electrophoretic devices, electroluminescent (EL) devices, electron emission element-including devices, such as field emission displays and surface-conduction electron-emitter displays.

What is claimed is:

1. An electro-optical device, comprising:
a first substrate;
a second substrate;
an electro-optical material in between the first and second substrates;
data lines extending in a first direction;
scanning lines extending in a second direction in such a manner that the scanning lines and data lines cross each other;
pixel electrodes and thin-film transistors each placed in regions corresponding to intersections of the scanning lines and data lines, the thin-film transistor disposed in between the first substrate and the data lines;
storage capacitors each disposed in between the first substrate and the data lines and each electrically connected to corresponding ones of the thin-film transistors and pixel electrodes;
a capacitor line disposed in between the electro-optical material and the data lines;
first junction electrodes formed using the same film as that for forming the data lines, each first junction electrode electrically connecting a corresponding constant potential capacitor electrode and the capacitor line; and
second junction electrodes formed using the same film as that for forming the data lines, each second junction electrode electrically connecting a corresponding pixel potential capacitor electrode of a storage capacitor and pixel electrodes, wherein the data lines, first junction electrodes, and second junction electrodes each include a nitride film.

2. The electro-optical device according to claim 1, wherein the data lines, first junction electrodes, and second junction electrodes each include the nitride film on a conductive layer.

3. The electro-optical device according to claim 2, wherein the data lines, first junction electrodes, and second junction electrodes have laminated layer structure including an aluminum film, titanium nitride film, and silicon nitride film.

4. The electro-optical device according to claim 1 further comprising third junction electrodes formed using the same film as that for forming the capacitor line, wherein the first junction electrodes are each electrically connected to the corresponding pixel electrodes with the corresponding third junction electrodes.

5. The electro-optical device according to claim 4, wherein the capacitor line and third junction electrodes each include a conductive layer and a nitride film disposed thereon.

6. The electro-optical device according to claim 5, wherein the capacitor line and third junction electrodes have laminated layer structure including an aluminum film, titanium nitride film, and silicon nitride film.

7. The electro-optical device according to claim 4 further comprising fourth junction electrodes formed on an insulating layer on which the thin-film transistors are formed, wherein the pixel potential capacitor electrodes are each electrically connected to the corresponding first junction electrodes with the corresponding fourth junction electrodes.

8. The electro-optical device according to claim 7, wherein the fourth junction electrodes are formed using the same film for forming gate electrodes of the thin-film transistors.

9. The electro-optical device according to claim 1, wherein the scanning lines are placed below the thin-film transistors and each electrically connected to the corresponding gate electrodes with contact holes, the gate electrodes being each disposed on corresponding semiconductor layers each included in the corresponding thin-film transistors.

10. The electro-optical device according to claim 1, wherein the storage capacitors each include corresponding dielectric layers each disposed between the corresponding pixel potential capacitor electrodes and constant potential capacitor electrodes, the dielectric layers include a plurality of sub-layers containing different materials, and one of the sub-layers contains a material having a dielectric constant larger than those of the materials of the other layers.

11. The electro-optical device according to claim 10, wherein the dielectric layers each include corresponding silicon dioxide sub-layers and silicon nitride sub-layers.

12. The electro-optical device according to claim 1, wherein the capacitor line is made of a light-shielding film and extend along the corresponding data lines and have a width larger than that of the data lines.

13. The electro-optical device according to claim 1 further comprising a first insulating layer disposed under the pixel electrodes as the base and a second insulating layer disposed under the capacitor line as the base, wherein at least the surface of the first insulating layer is planarized.

14. An electronic apparatus including an electro-optical device, the electro-optical device comprising, above a substrate:

data lines extending in a first direction; scanning lines extending in a second direction in such a manner that the scanning lines and data lines cross each other; pixel electrodes and thin-film transistors each placed in corresponding regions corresponding to intersections of the scanning lines and data lines; the storage capacitors disposed below the data lines and each electrically connected to the corresponding thin-film transistors and pixel electrodes; capacitor line disposed above the data lines; first junction electrodes, formed using the same film as that for forming the data lines, for each electrically connecting the corresponding pixel potential capacitor electrodes and pixel electrodes; and second junction electrodes, formed using the same film as that for forming the data lines, for each electrically connecting the corresponding constant potential capacitor electrodes and the capacitor line, wherein the data lines, first junction electrodes, and second junction electrodes each include a nitride film.

15. An electro-optical device, comprising:

a substrate;

data lines extending in a first direction;

scanning lines extending in a second direction in such a manner that the scanning lines and data lines cross each other;

pixel electrodes and thin-film transistors each placed in regions corresponding to intersections of the scanning lines and data lines, the thin-film transistor disposed below the data lines;

storage capacitors each disposed below the data lines and each electrically connected to the corresponding thin-film transistors and pixel electrodes;

a shielding layer disposed below the pixel electrodes and disposed to cover the data lines;

first junction electrodes, formed using the same film as that for forming the data lines, for each electrically connecting the corresponding constant potential capacitor electrodes and the shielding layer, second junction electrodes, formed using the same film as that for forming the data lines, for each electrically connecting the corresponding pixel potential capacitor electrodes of the storage capacitors and pixel electrodes; and wherein the data lines, first junction electrodes, and second junction electrodes each include a nitride film.

* * * * *